United States Patent
Kim et al.

(10) Patent No.: US 8,339,029 B2
(45) Date of Patent: Dec. 25, 2012

(54) LIGHT EMITTING DEVICES AND SYSTEMS HAVING TUNABLE CHROMATICITY

(75) Inventors: Wooh Jae Kim, Cary, NC (US); Gregory S. Blbee, Raleigh, NC (US); Mark McClear, Cary, NC (US); Robert E. Higley, Cary, NC (US); Joshua Markle, Raleigh, NC (US)

(73) Assignee: Cree, Inc., Durham, NC (US)

( * ) Notice: Subject to any disclaimer, the term of this patent is extended or adjusted under 35 U.S.C. 154(b) by 120 days.

(21) Appl. No.: 12/756,725

(22) Filed: Apr. 8, 2010

(65) Prior Publication Data

US 2010/0315012 A1    Dec. 16, 2010

Related U.S. Application Data

(63) Continuation-in-part of application No. 12/425,855, filed on Apr. 17, 2009, now Pat. No. 7,967,652.

(60) Provisional application No. 61/153,889, filed on Feb. 19, 2009.

(51) Int. Cl.
*H01J 1/62*    (2006.01)
*F21V 17/02*    (2006.01)

(52) U.S. Cl. ........................ 313/498; 362/231

(58) Field of Classification Search .................... None
See application file for complete search history.

(56) References Cited

U.S. PATENT DOCUMENTS

| 7,568,815 | B2 | 8/2009 | Lee et al. | |
| 2008/0238335 | A1* | 10/2008 | Lee et al. | 315/294 |

FOREIGN PATENT DOCUMENTS

| JP | 2009-123429 A | 6/2009 |
| WO | WO 2009/093895 A1 | 8/2009 |

OTHER PUBLICATIONS

Cree® XLamp® XR-E LED Data Sheet. Cree, Inc. 2009 (retrieved on Jun. 8, 2011). Retrieved from the Internet: URL:http://web.archive.org/web/20090206114628/http://cree.com/products/pdf/XLamp7090XR-E.pdf page 2.

Wood, Mike. "MacAdam Ellipses" *Out of the Wood*, Mike Wood Consulting LLC. (retrieved on Jun. 8, 2011). Retrieved from the internet: URL:http://www.mikewoodconsulting.com/articles/Protocol%20Fall%202010%20-%20MacAdam%20ellipses.pdf.

(Continued)

*Primary Examiner* — Anh Mai
*Assistant Examiner* — Britt D Hanley
(74) *Attorney, Agent, or Firm* — Myers Bigel Sibley & Sajovec

(57) ABSTRACT

A light emitting device package assembly includes a light emitting device package body, and first, second and third white light emitting devices on the package body, each of the first, second and third white light emitting devices emits light when energized having a chromaticity that falls within a respective one of first, second and third non-overlapping chromaticity regions in a two dimensional chromaticity space. The first, second and third chromaticity regions are spaced apart in the two dimensional chromaticity space by respective regions having at least the size of a seven step MacAdam ellipse. Related solid state luminaires and methods are also disclosed.

32 Claims, 20 Drawing Sheets

OTHER PUBLICATIONS

American National Standard: for electric lamps—"Specifications for the Chromaticity of Solid State Lighting Products" 2008 ANSI_NEMA_ANSLG C78.377-2008. (retrieved on Jun. 8, 2011). Retrieved from the internet: http://www.ledart.ru/files/img/C78.377-2008.pdf.

International Search Report Corresponding to International Application No. PCT/US2011/031081; Date of Mailing: Jun. 27, 2011; 12 pages.

International Preliminary Report on Patentability, Corresponding to International Application No. PCT/US2011/031081; Date of Mailing: Oct. 18, 2012.

* cited by examiner

| LUMINOUS FLUX BINS | | |
|---|---|---|
| BIN | MIN (lm) | MAX (lm) |
| V1 | 100 | 110 |
| V2 | 110 | 120 |
| V3 | 120 | 130 |

LIGHT EMITTING DEVICES AND SYSTEMS HAVING TUNABLE CHROMATICITY

RELATED APPLICATION

The present application is a continuation in part of U.S. application Ser. No. 12/425,855, filed Apr. 17, 2009 now U.S. Pat. No. 7,967,652, entitled "METHODS FOR COMBINING LIGHT EMITTING DEVICES IN A PACKAGE AND PACKAGES INCLUDING COMBINED LIGHT EMITTING DEVICES," which application claims the benefit of and priority to U.S. Provisional Patent Application No. 61/153,889, filed Feb. 19, 2009, entitled "METHODS FOR COMBINING LIGHT EMITTING DEVICES IN A PACKAGE AND PACKAGES INCLUDING COMBINED LIGHT EMITTING DEVICES," the disclosures of each of which are hereby incorporated herein by reference in their entirety.

FIELD OF THE INVENTION

The present invention relates to lighting, and more particularly to selecting lighting components used in lighting assemblies and light emitting packages including selected lighting components.

BACKGROUND

Solid state lighting devices are used for a number of lighting applications. A lighting panel including solid state lighting sources may be used, for example, for general illumination in a lighting fixture, or as a backlighting unit for an LCD display. Lighting panels commonly employ an arrangement of multiple light emitters such as fluorescent tubes and/or light emitting diodes (LEDs). An important attribute of the multiple light emitters may include uniformity of color and/or luminance in displayed output. In some cases, the light emitters may include multiple LED chips.

Presently, LED chips may be tested and grouped and/or binned according to their respective output and/or performance characteristics prior to being mounted in an LED package. The grouping may be performed using, for example, chromaticity values, such as the x, y values used in the CIE 1931 chromaticity diagram that was created by the International Commission on Illumination in 1931. In this manner, each light emitting device may be characterized by x, y coordinates. Emitters having similar x, y values may be grouped or binned to be used together, i.e., to be mounted together in a single LED package.

SUMMARY

A light emitting device package assembly according to some embodiments includes a light emitting device package body, and first, second and third white light emitting devices on the package body. Each of the first, second and third white light emitting devices emits light when energized having a chromaticity that falls within a respective one of first, second and third non-overlapping chromaticity regions in a two dimensional chromaticity space. The first, second and third chromaticity regions are spaced apart in the two dimensional chromaticity space by respective regions having at least the size of a seven step MacAdam ellipse.

The first chromaticity region may include light having a chromaticity that falls on a first side of a black body locus in the two dimensional chromaticity space, and the second chromaticity region may include light having a chromaticity that falls on a second side, opposite the first side, of the black body locus in the two dimensional chromaticity space.

The first and second chromaticity regions include light having a correlated color temperature not greater than 4500K and the third chromaticity region may include light having a color temperature not less than 4500K. In some embodiments, the first, second and third chromaticity regions may include light having a correlated color temperature between 2700K and 5000K.

The first, second and third chromaticity regions may be spaced apart in the two dimensional chromaticity space by respective regions having at least the size of a fourteen step MacAdam ellipse. In some embodiments, the first, second and third chromaticity regions may be spaced apart in the two dimensional chromaticity space by respective regions having at least the size of a twenty step MacAdam ellipse.

The light emitting device package body may include at least three pairs electrical leads that are mutually isolated from one another and that are electrically connected to respective anodes and cathodes of the first, second and third light emitting devices.

The light emitting device package assembly may further include a fourth white light emitting device on the package body. The fourth white light emitting device emits light when energized having a chromaticity that falls within a fourth chromaticity region in the two dimensional chromaticity space that is non-overlapping with the first, second and third chromaticity regions and that is spaced apart from the first, second and third chromaticity regions by respective regions having at least the size of a seven step MacAdam ellipse.

The third chromaticity region may include light having a chromaticity that falls on the first side of a black body locus in the two dimensional chromaticity space, and the fourth chromaticity region may include light having a chromaticity that falls on the second side of the black body locus in the two dimensional chromaticity space.

Combined light from the white light emitting devices may fall within a 7-step MacAdam ellipse of a point on the black body locus.

The first and second chromaticity regions may not overlap the blackbody locus, and the third chromaticity region may overlap the blackbody locus. In some embodiments, the third and fourth chromaticity regions may not overlap the blackbody locus.

The first and second chromaticity regions may include light having a correlated color temperature not greater than 3000K, and the third chromaticity region may include light having a color temperature greater than 3000K.

The first and second chromaticity regions may include light having x, y color coordinates within an area on a 1931 CIE Chromaticity Diagram defined by points having coordinates of (0.4373, 0.3893), (0.4562, 0.4260), (0.4813, 0.4319), and (0.4593, 0.3944). The third chromaticity region may include light having x, y color coordinates within an area on a 1931 CIE Chromaticity Diagram defined by points having coordinates of (0.3080, 0.3110), (0.3010, 0.3420), (0.3290, 0.3690), and (0.3290, 0.3300).

At least one of the first, second and third white light emitting devices may have a color rendering index that is at least about 10 points greater than a color rendering index than another one of the first, second and third white light emitting devices. In particular, at least one of the first, second and third white light emitting devices may have a color rendering index that is greater than 85 and the other one of the first, second and third white light emitting devices may have a color rendering index that is less than 85.

A solid state luminaire according to some embodiments includes first, second and third groups of white light emitting devices. Each of the first, second and third groups of white light emitting devices emit light when energized having a chromaticity that falls within a respective one of first, second and third non-overlapping chromaticity regions in a two dimensional chromaticity space. The first, second and third chromaticity regions are spaced apart in the two dimensional chromaticity space by respective regions having at least the size of a seven step MacAdam ellipse.

The first chromaticity region may include light having a chromaticity that falls on a first side of a black body locus in the two dimensional chromaticity space, and the second chromaticity region may include light having a chromaticity that falls on a second side, opposite the first side, of the black body locus in the two dimensional chromaticity space.

The first, second and third chromaticity regions may be spaced apart in the two dimensional chromaticity space by respective regions having at least the size of a fourteen step MacAdam ellipse. In some embodiments, the first, second and third chromaticity regions may be spaced apart in the two dimensional chromaticity space by respective regions having at least the size of a twenty step MacAdam ellipse.

The solid state luminaire may further include a fourth group of white light emitting devices The fourth group of white light emitting devices emits light when energized having a chromaticity that falls within a fourth chromaticity region in the two dimensional chromaticity space that is non-overlapping with the first, second and third chromaticity regions and that is spaced apart from the first, second and third chromaticity regions by respective regions having at least the size of a seven step MacAdam ellipse.

The third chromaticity region may include light having a chromaticity that falls on the first side of a black body locus in the two dimensional chromaticity space, and the fourth chromaticity region may include light having a chromaticity that falls on the second side of the black body locus in the two dimensional chromaticity space.

At least a first white light emitting device of the first, second and third groups of white light emitting devices may have a color rendering index that is at least about 10 points greater than a color rendering index than a second white light emitting device of the first, second and third groups of white light emitting devices.

The first white light emitting device may have a color rendering index that is greater than 85 and the second white light emitting device may have a color rendering index that is lower than 85.

A method of forming a light emitting device package assembly according to some embodiments includes providing a light emitting device package body, and defining first, second and third non-overlapping chromaticity regions in a two dimensional chromaticity space. The first, second and third chromaticity regions are spaced apart in the two dimensional chromaticity space by respective regions having at least the size of a seven step MacAdam ellipse. The method further includes providing a plurality of white light emitting devices that emit light having a chromaticity that falls within the defined chromaticity regions, selecting at least three of the plurality of white light emitting devices. Each of the three light emitting devices emits light from a different one of the defined chromaticity regions. The method further includes mounting the selected white light emitting devices on the light emitting device package body.

The first chromaticity region may include light having a chromaticity that falls on a first side of a black body locus in the two dimensional chromaticity space, and the second chromaticity region may include light having a chromaticity that falls on a second side, opposite the first side, of the black body locus in the two dimensional chromaticity space Each of the chromaticity regions may include a plurality of pairs of complementary subregions. Respective subregions in a pair of complementary subregions are arranged opposite a center point of the chromaticity region from one another. Selecting the at least three of the plurality of light emitting devices may include selecting at least six of the plurality of light emitting devices from at least six complementary subregions in pairs from respective pairs of complementary subregions.

Selecting a pair of light emitting device from one pair of complementary subregions may include selecting a first light emitting device having a first luminous flux from a first subregion that has a center point that is located a first distance from a center point of the chromaticity region, and selecting a second light emitting device having a second luminous flux from a second subregion that is complementary to the first subregion and that has a center point that is located a second distance from a center point of the chromaticity region, the first distance is smaller than the second distance and the first luminous flux is larger than the second luminous flux.

Some embodiments provide a method of operating a solid state luminaire including first, second and third groups of white light emitting devices, wherein each of the first, second and third groups of white light emitting devices emit light when energized having a chromaticity that falls within a respective one of first, second and third non-overlapping chromaticity regions in a two dimensional chromaticity space, and the first, second and third chromaticity regions are spaced apart in the two dimensional chromaticity space by respective regions having at least the size of a seven step MacAdam ellipse. The method includes independently controlling current through respective ones of the first, second and third strings of white light emitting diodes to generate combined white light having a chromaticity that is intermediate the first, second and third chromaticity regions.

In some embodiments, the light emitting devices include strings of light emitting devices connected in electrical series.

The first chromaticity region may include light having a chromaticity that falls on a first side of a black body locus in the two dimensional chromaticity space, and the second chromaticity region may include light having a chromaticity that falls on a second side, opposite the first side, of the black body locus in the two dimensional chromaticity space The method may further include measuring the chromaticity of the combined light, and altering current through at least one of the first, second and third strings of white light emitting diodes in response to the measured chromaticity.

A light emitting device package assembly according to further embodiments includes a light emitting device package body, and first, second and third white light emitting devices on the package body. Each of the first, second and third white light emitting devices emits light when energized having a chromaticity that falls within a respective one of first, second and third non-overlapping chromaticity regions in a two dimensional chromaticity space. A chromaticity of combined light output by said light emitting diode package assembly is tunable to at least one of a plurality of points within a tuning region within the two dimensional chromaticity space defined by at least the chromaticities of said first, second, and third light emitting devices.

The first, second and third chromaticity regions may be at least as large as a seven step MacAdam ellipse.

The first, second and third chromaticity regions may be spaced apart in the two dimensional chromaticity space by respective regions having at least the size of a seven step MacAdam ellipse. In some embodiments, the first, second and third chromaticity regions may be spaced apart in the two dimensional chromaticity space by respective regions having at least the size of a fourteen step MacAdam ellipse. In some further embodiments, the first, second and third chromaticity regions may be spaced apart in the two dimensional chromaticity space by respective regions having at least the size of a twenty step MacAdam ellipse.

A method of operating a solid state lighting apparatus according to further embodiments includes providing at least first, second, and third white light emitting devices in the solid state lighting apparatus that emit light when energized having chromaticities that fall within respective non-overlapping chromaticity regions in a two-dimensional chromaticity space, and tuning a chromaticity of combined light output by said solid state device to any of a plurality of points within a tuning region in the two dimensional chromaticity space defined by at least the respective chromaticities of said first, second, and third white light emitting devices.

DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

Figure 1A:
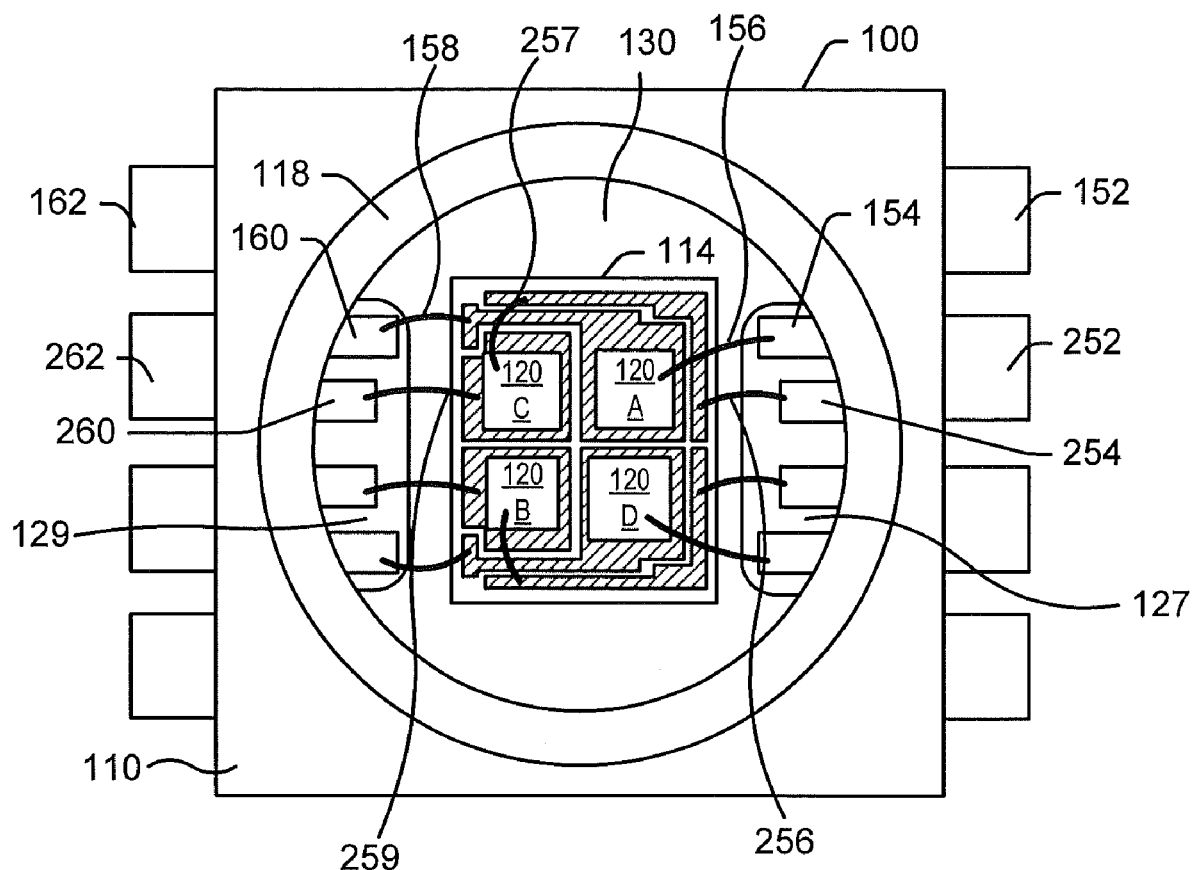
FIG. 1A is a plan view of a packaged light emitting diode according to some embodiments.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1B:
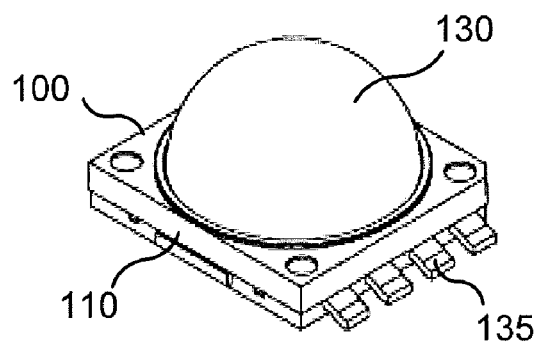
FIG. 1B is a perspective view of a packaged light emitting diode according to some embodiments.
Figure 1C:
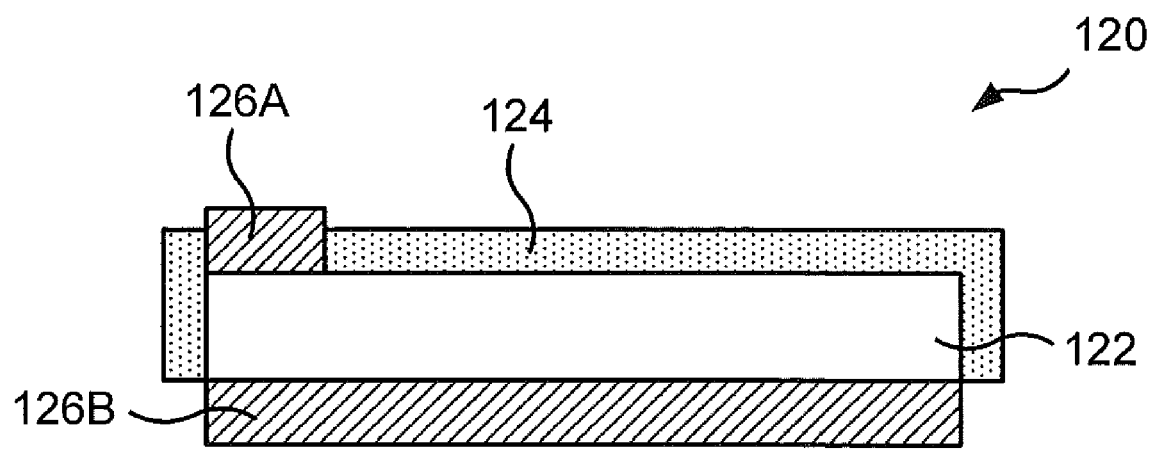
FIG. 1C illustrates an LED die that can be used in a packaged light emitting diode according to some embodiments.

Reference is now made to FIGS. 1A, 1B and 1C. FIG. 1A is a schematic plan view, and FIG. 1B is a perspective view illustrating a light emitting device (LED) package 100 including multiple light emitting devices (or light emitters) 120A-120D that are selected and grouped according to some embodiments of the present invention. FIG. 1C illustrates a light emitter 120 including an LED chip 122 that includes top and bottom anode/cathode contacts 126A, 126B and that is coated with a wavelength conversion phosphor 124 according to some embodiments. The LED package 100 may include a multi-chip module as described, for example, in U.S. patent application Ser. No. 12/154,691 filed May 23, 2008, the disclosure of which is incorporated herein by reference as if fully set forth herein in its entirety. In some embodiments, the light emitters 120A-120D may have both anode and cathode contacts on the same side of the device. Accordingly, the present invention is not limited to devices including light emitters having a vertical device structure with anode and cathode contacts on opposite sides of the device.

Referring to FIG. 1A, the package 100 may include a submount 114 including a plurality of bondpads configured to receive a respective plurality of LED chips 120A to 120D.

The package 100 includes a body 110 having an upper surface including a central region on which the submount 114 is positioned. The submount 114 includes respective pairs metal traces that provide chip and/or wire bonding pads. A reflector 118 may surround the central region of the body 110 and define an optical cavity above the LED chips 120A to 120D mounted on the submount 114. A lens 130 may be affixed over the LED chips 120A-120D to provide a desired angular emission pattern of light from the LED chips 120A-120D, and/or to increase light extraction from the LED package 100.

The package 100 further includes a first external lead 152 that includes at least a portion 154 thereof exposed within a recess 127 in the body 110. The exposed portion 154 of the external lead 152 is coupled to an anode or cathode bondpad on the first LED chip 120A via a wirebond connection 156. The other bondpad (i.e. cathode or anode) of the first LED chip 120A is coupled to a conductive trace on the submount 114 that is coupled to a second external lead 162 via a wirebond connection 158 to a portion 160 of the second external lead 162 that is exposed within a recess 129 in the body 110 of the package 100. Thus, the first external lead 152 and the second external lead 162 provide respective external anode/cathode contacts for the first LED chip 120A.

Similarly, a third external lead 252 includes at least a portion 254 thereof exposed within the recess 127. The exposed portion 254 of the third external lead 252 is connected to an electrical trace via a wirebond connection 256 and then to an anode or cathode bondpad of a second LED 120C via a wirebond connection 257. The other (i.e. cathode or anode) bond pad of the second LED 120C is coupled to a third electrical trace, and the third electrical trace is connected to a fourth external lead 262 via a wirebond connection 259 to a portion 260 of the fourth external lead 262 exposed in the recess 129.

The third and fourth LED chips 120B and 120D may likewise be connected to respective external leads that provide anode/cathode connections for the LED chips.

In some embodiments, the first and third external leads 152, 252 on one side of the package 100 may include cathode contacts, while the second and fourth external leads 162, 262 on the other side of the package 100 may include anode contacts, or vice-versa.

It will be appreciated that in some embodiments of the invention, the LED chips 120A to 120D may be isolated from one another, and may not share any common contacts, which may facilitate the interconnection of LED chips of adjacently mounted packages 100 into a desired configuration, such as to form series strings of LED chips.

Accordingly, in some embodiments, each of the light emitting devices 120A-120D in the package 100 may be driven independently of the other devices in the package. That is, the package may include separate anode/cathode leads for each of the LEDs 120A-120D. Having individually drivable light emitting devices may permit the LEDs to be individually controlled, for example driven at different current levels, which may enable a lighting system to compensate for brightness variations among the light emitters in a given package 100 to achieve a desired color point.

Although four light emitters 120A-120D are illustrated, the package 100 could include more or fewer light emitters therein.

In some embodiments, the light emitters 120A-120D may be covered or coated with a wavelength conversion material 124, such as a phosphor, that converts at least a portion of light emitted by the light emitters 120A-120D to a different wavelength or color.

In particular embodiments, the LED package 100 may include a multi-chip LED package, such as an MC-E LED available from Cree, Inc., the assignee of the present invention.

In particular embodiments, the LED package 100 may include four phosphor coated power LED chips having dimensions of about 1000 μm×1000 μm or more. Some embodiments provide a 7 mm×9 mm LED package including four 1.4 mm×1.4 mm phosphor coated power LED chips. Such a package may be capable of generating more than 1,000 lumens of light output at 700 mA using approximately 9.8 W of power. One thousand lumens is approximately equivalent to the light produced by a standard 75 watt incandescent light bulb.

Some embodiments may provide binning and chip selection techniques for use in LED package manufacturing that may provide extremely tightly color-matched LEDs in an LED package. In particular, binning and chip selection techniques according to some embodiments may provide a tighter (i.e. narrower or smaller) color distribution than previously available, allowing users to address applications with very tight color requirements and/or reducing waste of LED chips that previously could not be used in a particular packaging application. In particular embodiments, a color distribution can be achieved that is about 79% tighter than can be achieved with standard binning techniques.

In some embodiments, the light emitters 120A-120D may be grouped and/or selected for inclusion in a particular LED package 100 responsive to the combined chromaticity and/or luminous flux values of the light emitters 120A-120D. Chromaticities of the light emitters 120A-120D may be selected so that the combined light, that is a mixture of light from the light emitters 120A-120D, may have a desired chromaticity. In this manner, the perceived color of light generated by the LED package 100 may appear to have a desired chromaticity, e.g. white, based on the apparent chromaticity of the combination, even if none (or fewer than all) of the light emitters 120A-120D individually emits light having the desired chromaticity. Furthermore, in some embodiments, the luminous flux of the light emitters 120A-120D may be selected so that the combined mixture of light has a desired luminous flux level.

Figure 2:
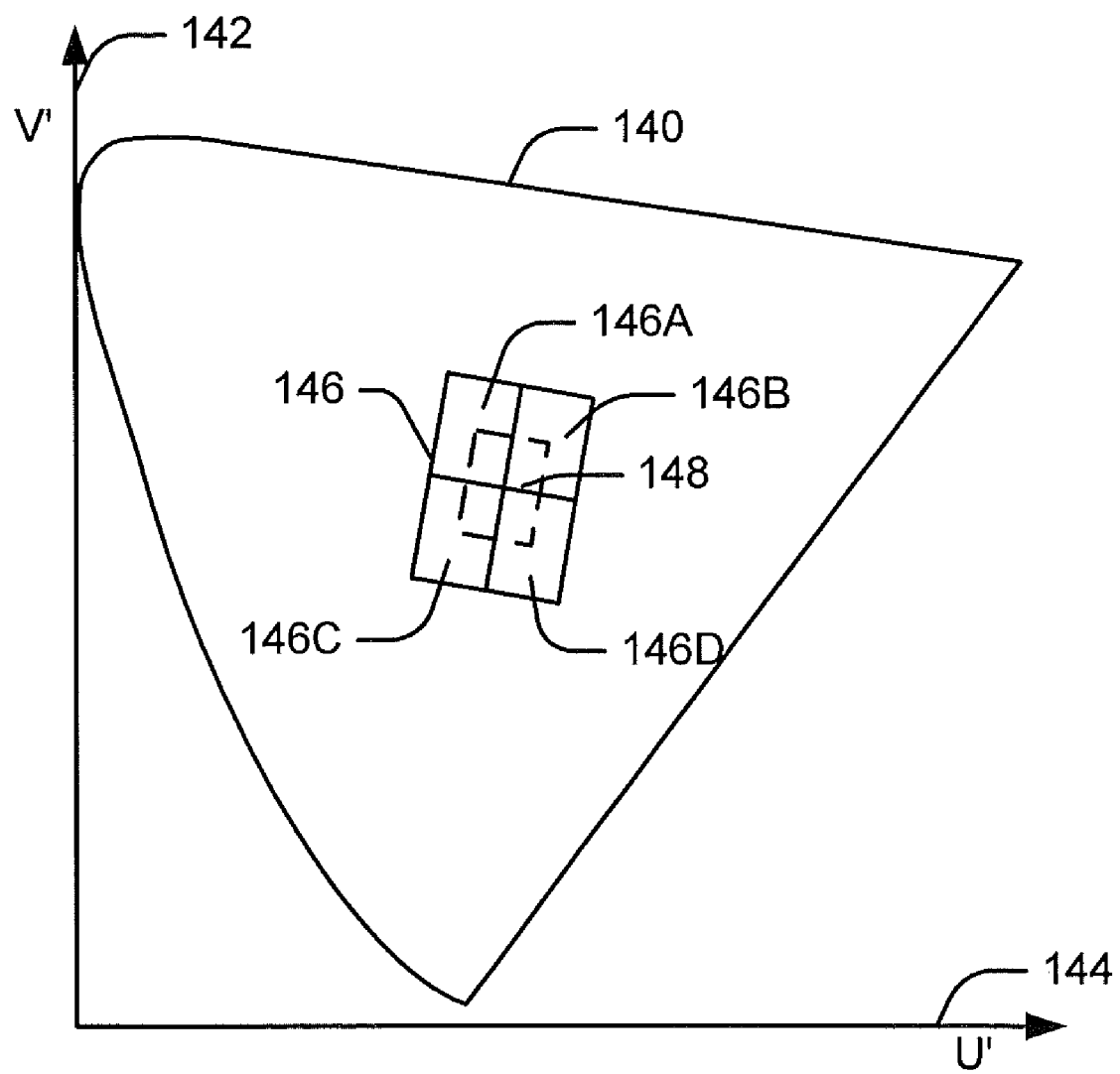
FIG. 2 is a chromaticity diagram illustrating a chromaticity region corresponding to light emitters having similar chromaticity coordinates according to some embodiments.

For example, reference is made to FIG. 2, which is a two-dimensional chromaticity diagram illustrating a chromaticity region 146 within a chromaticity space 140. It will be appreciated that a chromaticity diagram is a two-dimensional representation of all visible colors. Each visible color, which has a distinct hue and saturation, can be represented by a point in the diagram. Various chromaticity spaces have been defined, including the 1931 CIE chromaticity space and the 1976 CIE chromaticity space created by the International Commission on Illumination (CIE).

The light emitted by a light emitter 120A-120D may be represented by a point on a chromaticity diagram. Consequently, a region on a chromaticity diagram may represent light emitters having similar chromaticity coordinates.

The chromaticity region 146 is subdivided into multiple chromaticity subregions (or simply subregions) 146A-146D. The subregions 146A-146D may correspond to multiple groups of light emitters having similar chromaticity coordinates. As illustrated in FIG. 2, the chromaticity space 140 may be defined in terms of u' and v' axes 144, 142 such that any point in the color space may be expressed as a coordinate pair (u', v'). It will be appreciated that the chromaticity region 146 shown in FIG. 2 may be in any desired location within the chromaticity space 140 and may have any desired size or shape. The size, shape and location of the chromaticity region 146 in FIG. 2 are arbitrary and are shown for illustrative purposes only.

According to some embodiments, an LED package 100 includes a plurality of N light emitters 120A-120D. Although the LED package 100 of FIG. 1 is illustrated as including four (4) light emitters, it will be appreciated that N could be any number greater than two (2). Each of the N light emitters 120A-120D has a chromaticity that falls within one of N subregions 146A-146D defined within a chromaticity region 146. The combined light from the N light emitters 120A-120D may fall within a target chromaticity region 148 that is defined within and is smaller than the chromaticity region 146 within which the N subregions 146A-146D are defined.

For example, an LED package 100 according to some embodiments may include first to fourth light emitters 120A to 120D that are selected based on their chromaticity points falling within one of first to fourth emitter group subregions 146A-146D. For example, one of the light emitters 120A may have a chromaticity that falls within a first subregion 146A, one of the light emitters 120B may have a chromaticity that falls within a second subregion 146B, one of the light emitters 120C may have a chromaticity that falls within a third subregion 146C, and one of the light emitters 120D may have a chromaticity that falls within a fourth subregion 146D.

It will be appreciated, however, that it may not be necessary for an LED package 100 to include a light emitter 120A-120D from each of the defined subregions 146A-146D, depending on the chromaticities of the selected light emitters 120A-120D. Furthermore, each of the light emitters 120A-120D does not have to be in a unique subregion 146A-146D. For example, more than one of the light emitters 120A-120D may fall within a single subregion 146A-146D.

In some embodiments, the subregions may be defined such that each subregion in the plurality of subregions shares a boundary line with at least two other subregions. Also, each subregion may at least partially overlap the target chromaticity region 148. In some embodiments, the subregions 146A-146D may completely fill the chromaticity region 146, so that a chromaticity point in the chromaticity region 146 falls within at least one defined subregion.

Accordingly, some embodiments define a chromaticity region 146 that is larger than and encompasses a target chromaticity region 148. The chromaticity region 146 is further divided into a plurality of N subregions 146A to 146D that are arranged in a two-dimensional matrix of subregions. An LED package 100 includes a plurality of N light emitters 120A to 120D, each of which has a chromaticity that falls within one of the N subregions 146A to 146D.

In some embodiments, the chromaticity of an individual light emitter 120A-120D may be determined based on the color of light emission from the light emitter 120A-120D without any color conversion or shifting using phosphors or other luminophoric material. Alternatively, in some embodiments, the chromaticity of an individual light emitter 120A-120D may be determined based on the combined color of light emission from the light emitter 120A-120D and of light emission from a phosphor that is stimulated by the emission from the light emitter 120A-120D. For example, in some embodiments, the light emitters 120A-120D may comprise blue and/or ultraviolet LEDs that are coated with a phosphor or phosphor-bearing material that is arranged to receive at least some light emitted by the light emitters 120A-120D and to responsively emit light having a different wavelength. The combined light emitted by the light emitter and the phosphor may appear white. Such color conversion is well known in the art.

Phosphor coating of LED chips is described, for example, in U.S. Pat. Nos. 6,853,010 and 7,217,583, the disclosures of which are incorporated herein by reference as if fully set forth herein.

In some embodiments, one or more of the light emitters 120A-120D may be coated with phosphor, while one or more of the light emitters 120A-120D may not be coated with phosphor. In some embodiments, none of the light emitters 120A-120D may be coated with phosphor.

In some embodiments, light emitters 120A-120D may be selected for inclusion in an LED package 100 based on their chromaticity points being about equidistant from the target chromaticity region 148, or a desired chromaticity point within the target chromaticity region 148, or being in subregions 146A-146D that are about equidistant from the desired chromaticity point or region. However, it will be appreciated that the chromaticity points of the light emitters 120A-120D need not be equidistant from the desired chromaticity point or region.

In some embodiments, the desired chromaticity point or region 148 may be different from the chromaticity of light emitted by some or all of the light emitters 120A-120D in the package 100. For example, in some embodiments, an LED package 100 includes four light emitters 120A-120D. Some, e.g., three, of the light emitters 120A-120C may include blue light emitting diodes coated with a yellow phosphor and having a combined light emission (chip plus phosphor) that appears yellow-green to an observer. As used herein, "white light" generally refers to light having a chromaticity point that is within a 10-step MacAdam ellipse of a point on the black body locus (BBL) having a correlated color temperature (CCT) between 2700K and 6500K, while "yellow-green light" generally refers to light having x, y color coordinates within an area on a 1931 CIE Chromaticity Diagram defined by points having coordinates (0.32, 0.40), (0.36, 0.48), (0.43, 0.45), (0.42, 0.42), (0.36, 0.38), as described in detail in U.S. Pat. No. 7,213,940, the disclosure of which is incorporated herein by reference. Thus, the target chromaticity region 148 for combined light from the three light emitters 120A-120C may not be in a region of a chromaticity space that is conventionally designated as "white." The fourth light emitter may comprise a red LED that emits light at a wavelength selected such that combined light from all four light emitters 120A-120D appears white to an observer, and in some embodiments falls along the black body locus.

Figure 3A:
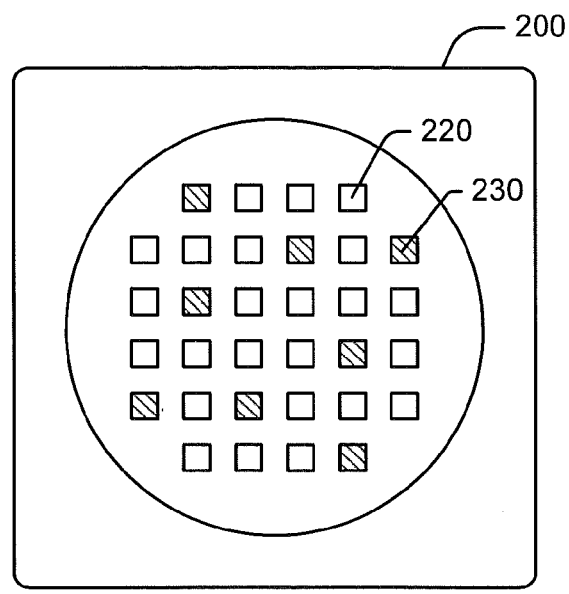
FIG. 3A is a plan view of a packaged light emitting diode according to further embodiments.
Figure 3B:
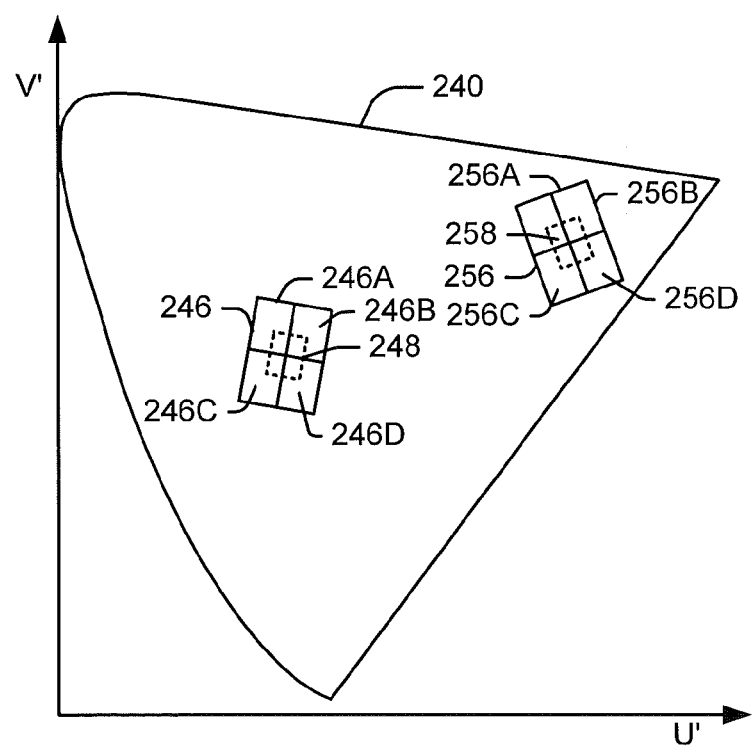
FIG. 3B is a chromaticity diagram illustrating a plurality of chromaticity regions corresponding to different groups of light emitters having similar chromaticity coordinates according to some embodiments.

Referring to FIG. 3A, an LED package 200 that includes multiple groups of multiple light emitters is illustrated. For example, the LED package 211 includes a first group of 24 white or near-white light emitters 220 and a second group of eight red light emitters 230 for a total of 32 light emitters. Light emitters in each group of light emitters may be selected in accordance with embodiments of the invention. For example, an LED package 200 may include a plurality of "white" LED chips 220 comprising phosphor-coated blue emitting LED chips and a plurality of red light emitting LED chips 230. As used herein, "red light" refers to visible light having a dominant wavelength of about 600 nm or more. Referring to FIG. 3B, the white LED chips 220 may be selected from a plurality of subregions 246A-246D that are defined in a chromaticity region 246 within a chromaticity space 240 that includes a first target chromaticity region 248 for combined light emitted by the white light emitters. Furthermore, the red light emitters 230 may be selected from a plurality of subregions 256A-256D that are defined in a chromaticity region 256 that includes a second target chromaticity region 258 of combined light emitted by the red light emitters 230. As the combined light emitted by the white light emitters falls within the first target chromaticity region 248 and the combined light emitted by the red light emitters 230 falls within the second target chromaticity region 258, the color of the total combined light emitted by the LED package 200 may be more consistent overall.

It will be appreciated that the chromaticity regions 246, 256 shown in FIG. 3B may be in any desired location within the chromaticity space 240 and may have any desired size or shape. The size, shape and location of the chromaticity regions 246, 256 in FIG. 3B are arbitrary and are shown for illustrative purposes only.

Figure 4A:
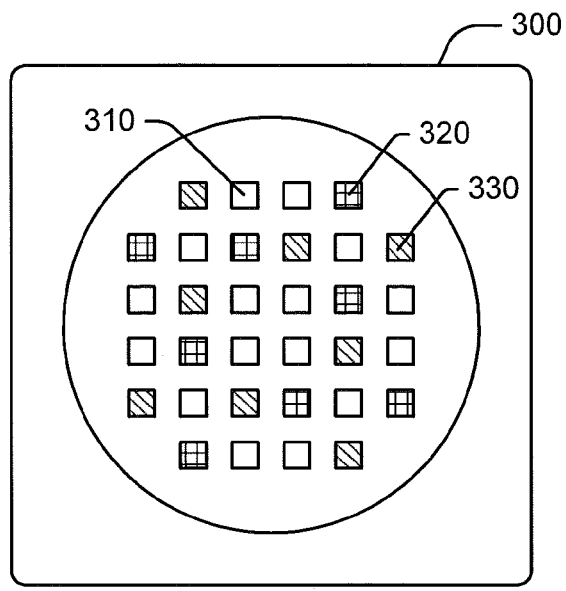
FIG. 4A is a plan view of a packaged light emitting diode according to further embodiments.
Figure 4B:
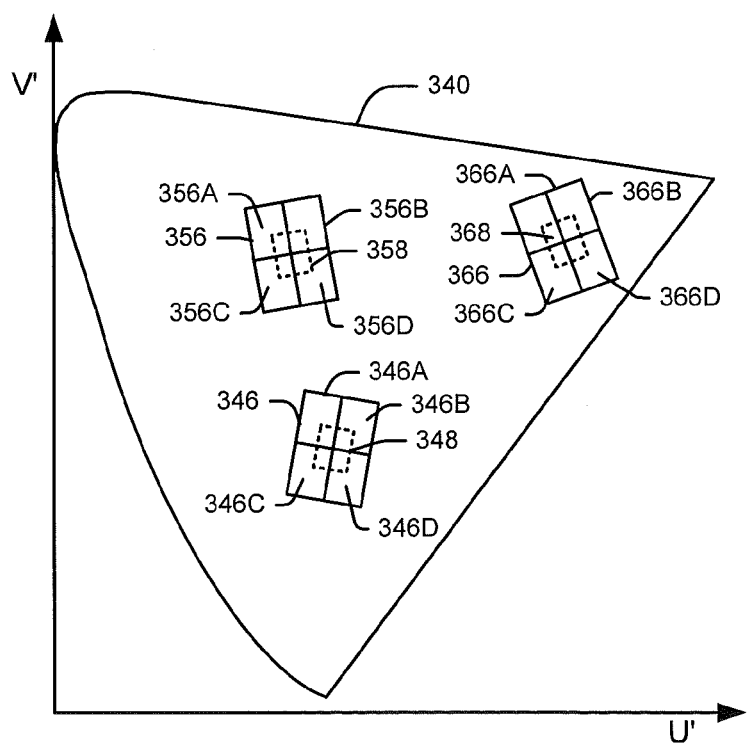
FIG. 4B is a chromaticity diagram illustrating a plurality of chromaticity regions corresponding to different groups of light emitters having similar chromaticity coordinates according to some embodiments.

As a further example, referring to FIGS. 4A and 4B, an LED package 300 may include a plurality of "white" LED chips 310 comprising phosphor-coated blue emitting LED chips, a plurality of yellow-green LED chips 320 comprising phosphor-coated blue emitting LED chips and a plurality of red emitting LED chips 330. The white LED chips 310 may be selected from a plurality of subregions 346A-346D that are defined in a chromaticity region 346 within a chromaticity space 340 that includes a target chromaticity region 348 of combined light emitted by the white light emitters 310. The yellow-green LED chips 320 may be selected from a plurality of subregions 356A-356D that are defined in a chromaticity region 356 of the chromaticity space 340 that includes a target chromaticity region 358 of combined light emitted by the yellow-green light emitters. The red LED chips 330 may be selected from a plurality of subregions 366A-366D that are defined in a chromaticity region 366 of the chromaticity space 340 that includes a target chromaticity region 368 of combined light emitted by the red light emitters 330. The respective combined colors of the white, yellow-green and red light emitters may fall within the target chromaticity regions 348, 358. 368. Accordingly, the color of combined light emitted by the LED package 300 may be more consistent.

It will be appreciated that the chromaticity regions 346, 356 and 366 shown in FIG. 4B may be in any desired location within the chromaticity space 340 and may have any desired size or shape. The size, shape and location of the chromaticity regions 346, 356, 366 in FIG. 4B are arbitrary and are shown for illustrative purposes only.

Figure 4C:
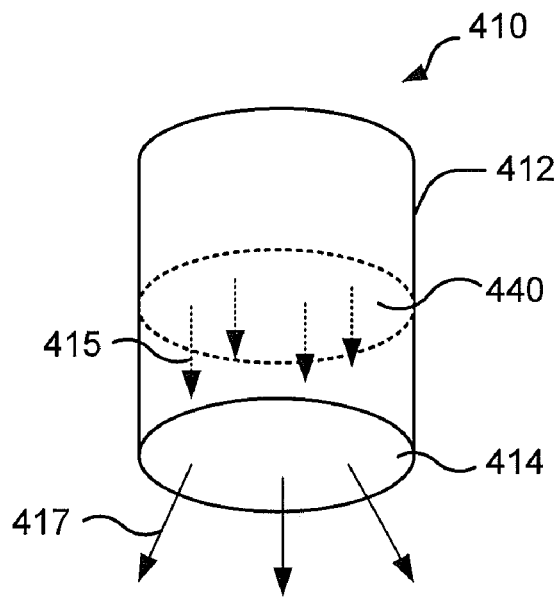
FIG. 4C illustrates a luminaire in accordance with some embodiments.
Figure 4D:
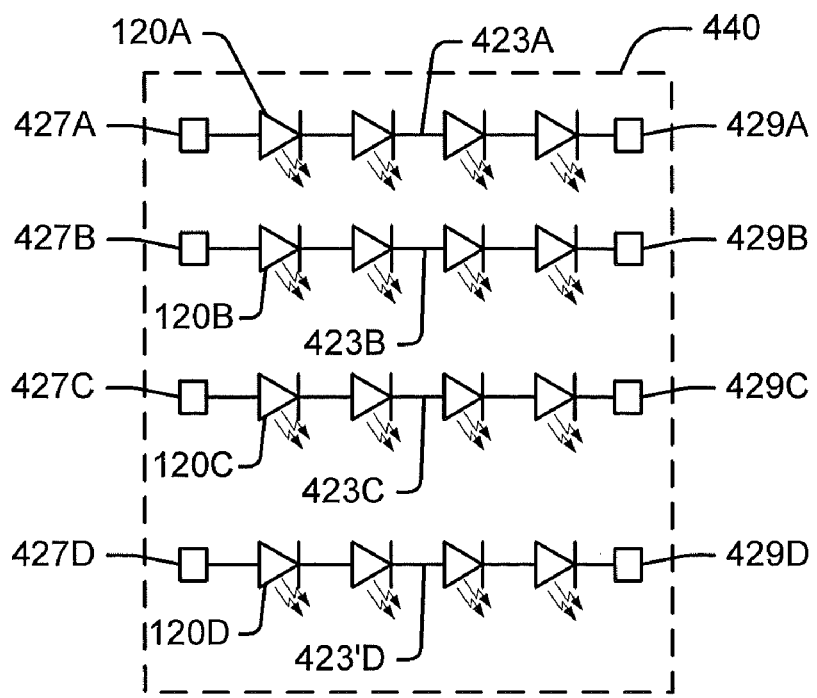
FIG. 4D illustrates electrical connection of LEDs in a luminaire according to some embodiments.

Referring to FIGS. 4C and 4D, a luminaire 410 according to some embodiments is illustrated. The luminaire 410 shown in FIGS. 4C and 4D is a "can" lighting fixture that may be suitable for use in general illumination applications as a down light or spot light. However, it will be appreciated that a lighting apparatus according to some embodiments may have a different form factor. For example, a luminaire according to some embodiments can have the shape of a conventional light bulb, a pan or tray light, an automotive headlamp, a conical shape, or any other suitable form.

The luminaire 410 generally includes a cylindrical outer housing 412 in which a lighting panel 440 is arranged. In the embodiments illustrated in FIGS. 4C and 4D, the lighting panel 440 has a generally circular shape so as to fit within an interior of the cylindrical housing 412. Light is generated by solid state lighting devices (LEDs) 120A to 120D, which are mounted on the lighting panel 440, and which are arranged to emit light 415 towards a diffusing lens 414 mounted at the end of the housing 412. Diffused light 417 is emitted through the lens 414. In some embodiments, the lens 414 may not diffuse the emitted light 415, but may redirect and/or focus the emitted light 415 in a desired near-field or far-field pattern.

The LEDs 120A to 120D in the luminaire 410 may include white emitting LEDs. The LEDs 120A to 120D in the luminaire 410 may be electrically interconnected in respective strings 423A to 423D, as illustrated in the schematic circuit diagram in FIG. 4D. Each string 423A to 423D may be connected to a respective anode terminal 427A to 427D and a cathode terminal 429A to 429D.

Although four strings 423A to 423D are illustrated in FIG. 4D, it will be appreciated that the luminaire 410 may include more or fewer strings. Furthermore, luminaire 410 may include other strings, such as strings of red emitting LEDs that may be provided to alter the chromaticity of the combined light emitted by the luminaire 410.

Figure 4E:
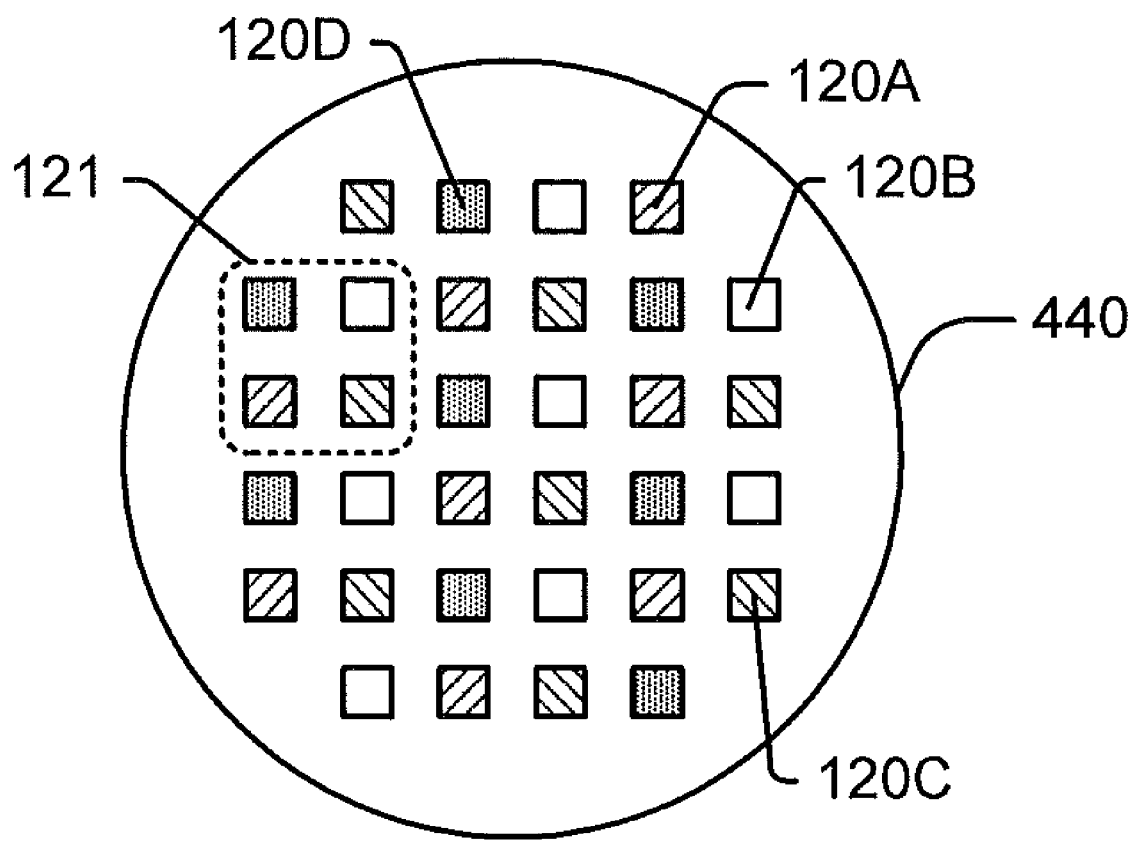
FIG. 4E illustrates a lighting panel according to some embodiments.

Referring to FIG. 4E, a lighting panel 440 including a plurality of LEDs 120A to 120D mounted thereon is illustrated. The LEDs 120A to 120D having different chromaticities may be distributed about evenly over the surface of the lighting panel 440 for spatial color balance. For example, as shown in FIG. 4E, any arbitrary square grouping 121 of four neighboring LEDs 120A to 120D on the panel 440 may include one each of the LEDs 120A, 120B, 120C and 120D.

Figure 5:
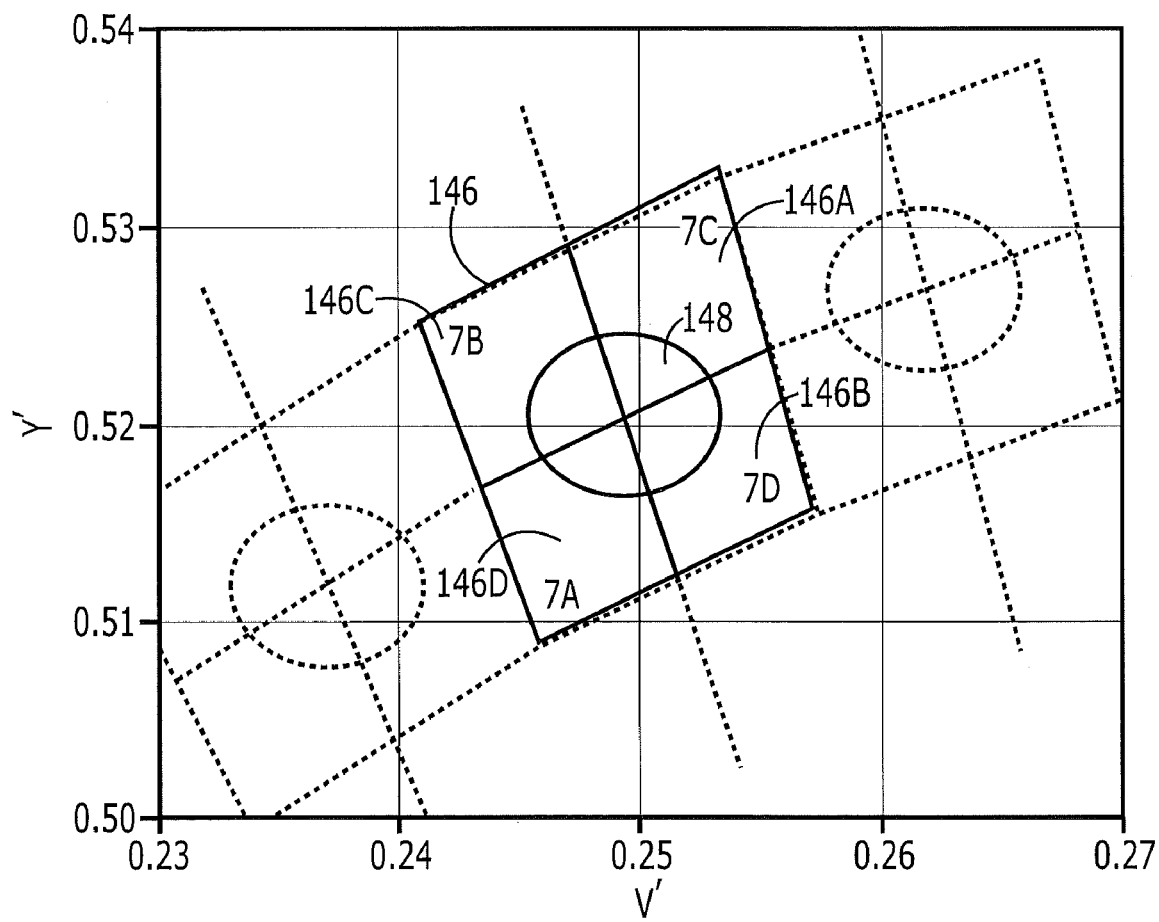
FIG. 5 is a chromaticity diagram including a chromaticity region that is subdivided into chromaticity subregions according to some embodiments.

Referring to FIG. 5, a target chromaticity region 148 can be defined as a region that is within and encompassed by a chromaticity region 146 that is defined in the proposed ANSI standard C78.377A for chromaticity of solid state light emitting devices. For example, in some embodiments, the chromaticity region 146 may encompass a point on the black body locus (BBL) having a color temperature of about 3050K. While FIG. 5 illustrates a chromaticity region 146 as represented on a 1976 CIE u'v' chromaticity diagram, the chromaticity region 146 may correspond to a region encompassing a point on the BBL of a 1931 CIE x,y chromaticity diagram. In some embodiments, the chromaticity region 146 may be bounded by a quadrilateral defined by points having the following (x,y) coordinates on a 1931 CIE chromaticity x,y diagram: A (0.4147,0.3814); B (0.4299,0.4165); C (0.4562, 0.4260); D (0.4373,0.3893).

Figure 6A:
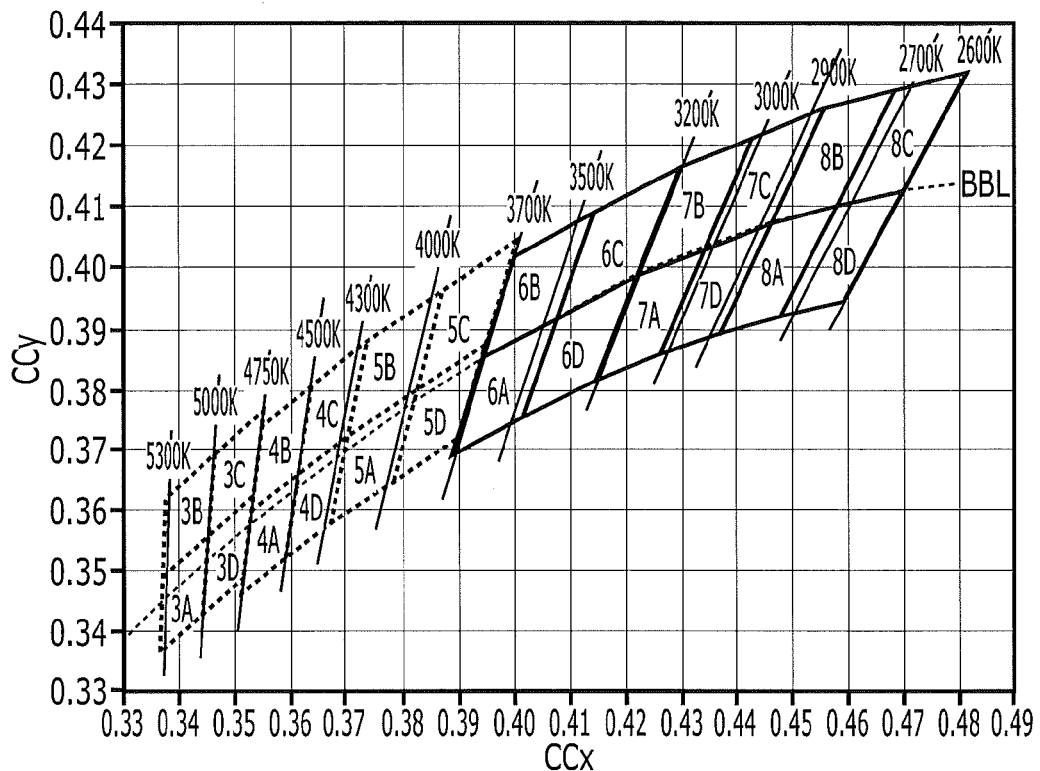
FIG. 6A illustrates standard chromaticity regions, or bins, on a chromaticity diagram.

A plurality of possible chromaticity regions, as represented on 1931 CIE chromaticity diagrams, are illustrated in FIG. 6A, on which emitter group regions 3A-3D, 4A-4D, 5A-5D, 6A-6D and 7A-7D are shown. Numeric definitions of the (x,y) coordinates of these emitter group regions are shown in the following Table:

TABLE 1

Emitter Group Regions 3A-3D to 8A-8D

| Region | x | y |
|---|---|---|
| 3A | 0.3371 | 0.3490 |
|  | 0.3451 | 0.3554 |
|  | 0.3440 | 0.3428 |
|  | 0.3366 | 0.3369 |
| 4A | 0.3512 | 0.3465 |
|  | 0.3529 | 0.3597 |
|  | 0.3615 | 0.3659 |
|  | 0.3590 | 0.3521 |
| 5A | 0.3670 | 0.3578 |
|  | 0.3702 | 0.3722 |
|  | 0.3825 | 0.3798 |
|  | 0.3783 | 0.3646 |
| 6A | 0.3889 | 0.3690 |
|  | 0.3941 | 0.3848 |
|  | 0.4080 | 0.3916 |
|  | 0.4017 | 0.3751 |
| 7A | 0.4147 | 0.3814 |
|  | 0.4221 | 0.3984 |
|  | 0.4342 | 0.4028 |
|  | 0.4259 | 0.3583 |
| 8A | 0.4373 | 0.3893 |
|  | 0.4465 | 0.4071 |
|  | 0.4582 | 0.4099 |
|  | 0.4483 | 0.3919 |
| 3B | 0.3376 | 0.3616 |
|  | 0.3463 | 0.3687 |
|  | 0.3451 | 0.3554 |
|  | 0.3371 | 0.3490 |
| 4B | 0.3529 | 0.3597 |
|  | 0.3548 | 0.3736 |
|  | 0.3641 | 0.3804 |
|  | 0.3615 | 0.3659 |
| 5B | 0.3702 | 0.3722 |
|  | 0.3736 | 0.3874 |
|  | 0.3869 | 0.3958 |
|  | 0.3825 | 0.3798 |
| 6B | 0.3941 | 0.3848 |
|  | 0.3996 | 0.4015 |
|  | 0.4146 | 0.4089 |
|  | 0.4080 | 0.3916 |
| 7B | 0.4221 | 0.3984 |
|  | 0.4299 | 0.4165 |
|  | 0.4430 | 0.4212 |
|  | 0.4342 | 0.4028 |
| 8B | 0.4465 | 0.4071 |
|  | 0.4562 | 0.4260 |
|  | 0.4687 | 0.4289 |
|  | 0.4582 | 0.4099 |
| 3C | 0.3463 | 0.3687 |
|  | 0.3551 | 0.3760 |
|  | 0.3533 | 0.3620 |
|  | 0.3451 | 0.3554 |
| 4C | 0.3615 | 0.3659 |
|  | 0.3641 | 0.3804 |
|  | 0.3736 | 0.3874 |
|  | 0.3702 | 0.3722 |
| 5C | 0.3825 | 0.3798 |
|  | 0.3869 | 0.3958 |
|  | 0.4006 | 0.4044 |
|  | 0.3950 | 0.3875 |
| 6C | 0.4080 | 0.3916 |
|  | 0.4146 | 0.4089 |
|  | 0.4299 | 0.4165 |
|  | 0.4221 | 0.3984 |
| 7C | 0.4342 | 0.4028 |
|  | 0.4430 | 0.4212 |
|  | 0.4562 | 0.4260 |
|  | 0.4465 | 0.4071 |
| 8C | 0.4582 | 0.4099 |
|  | 0.4687 | 0.4289 |
|  | 0.4813 | 0.4319 |
|  | 0.4700 | 0.4126 |
| 3D | 0.3451 | 0.3554 |
|  | 0.3533 | 0.3620 |
|  | 0.3515 | 0.3487 |
|  | 0.3440 | 0.3428 |
| 4D | 0.3590 | 0.3521 |
|  | 0.3615 | 0.3659 |
|  | 0.3702 | 0.3722 |
|  | 0.3670 | 0.3578 |
| 5D | 0.3783 | 0.3646 |
|  | 0.3825 | 0.3798 |
|  | 0.3950 | 0.3875 |
|  | 0.3898 | 0.3716 |
| 6D | 0.4017 | 0.3751 |
|  | 0.4080 | 0.3916 |
|  | 0.4221 | 0.3984 |
|  | 0.4147 | 0.3814 |
| 7D | 0.4259 | 0.3853 |
|  | 0.4342 | 0.4028 |
|  | 0.4465 | 0.4071 |
|  | 0.4373 | 0.3893 |
| 8D | 0.4483 | 0.3919 |
|  | 0.4582 | 0.4099 |
|  | 0.4700 | 0.4126 |
|  | 0.4593 | 0.3944 |

According to some embodiments, a desired emitter group region may be defined by a standard, such as the ANSI C78.377A LED binning standard. Conventionally, to ensure that combined light emitted by a package falls within a standard chromaticity region, or bin, only light emitters that fall within the standard bin are chosen for inclusion within the package, and other light emitters that do not fall within the standard bin are discarded or ignored. However, some embodiments enable the selection and use of light emitters having chromaticity points that fall outside a standard bin to be used in a package that emits combined light having a chromaticity point within the standard bin, and in some cases, within a chromaticity region that is even smaller than the standard bin. As used herein, a "bin" refers to a defined region of a chromaticity space. Typically, LEDs are sorted into defined bins for manufacturing purposes based on the chromaticity of light emitted by the LEDs, in a process referred to as "binning." In the ANSI C78.377A standard, bins are defined as quadrangles that encompass a 7-step MacAdam ellipse, which is the standard tolerance defined for compact fluorescent lamps by the Department of Energy Energy Star program. However, because the bins are defined as quadrangles, some chromaticity points that fall within the bin may nevertheless fall outside the 7 step MacAdam ellipse used to defined the bin. Thus, in packaging methods in which light emitters are simply selected from a desired bin, some packaged LEDs can emit light that falls within the defined bin that has a visibly different color from other packaged LEDs that also emit light that falls within the bin. It will be appreciated that bins can be defined as shapes other than quadrangles. For example, bins could be defined as ellipses such as MacAdam ellipses, triangles, circles or any other geometric shape. Furthermore, bins can be defined in any color space, including a 1931 CIE (x,y) color space, a 1976 CIE (u',v') color space, or any other color space.

Figure 6B:
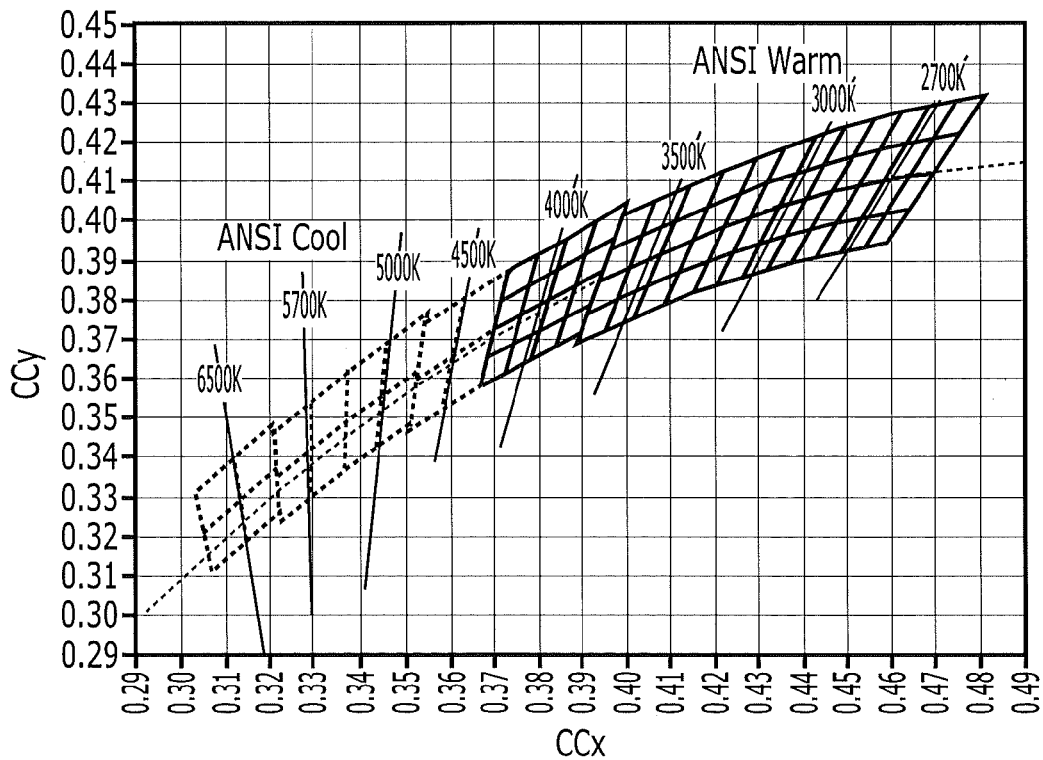
FIG. 6B illustrates standard chromaticity bins on a chromaticity diagram that have been further subdivided into smaller bins.

In some embodiments, the standard bins can be further subdivided into even smaller bins that can be used to define chromaticities. For example, FIG. 6B illustrates standard chromaticity bins defined according to the ANSI C78.377A LED binning standard that have been further subdivided into smaller bins. Smaller bins offer improved color consistency among LED lighting fixtures. In some embodiments, 4 sub-bins may be defined within each ANSI quadrangle. In further embodiments, one or more of the warm/neutral ANSI quadrangles may be sub-divided into 16 discrete bins, each of which may be 94 percent smaller than the quadrangles defined in the ANSI C78.377A LED binning standard.

Figure 7:
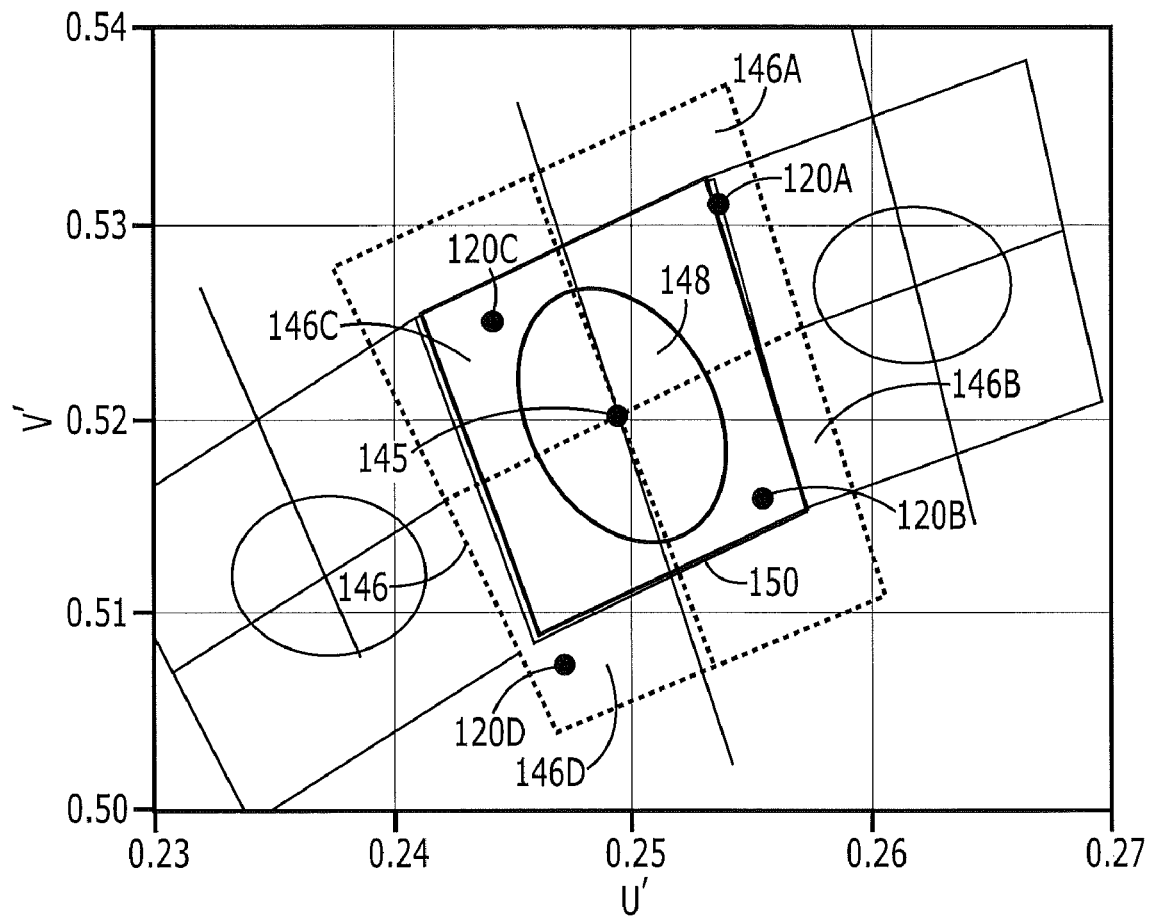
FIG. 7 illustrates a chromaticity region that is subdivided into subregions according to some embodiments.

Referring to FIG. 7, a standard bin 150 defined in the ANSI C78.377A LED binning standard is shown. According to some embodiments, a chromaticity region 146 is defined. The chromaticity region 146 may defined as contiguous with the defined bin 150 in some embodiments. In other embodiments, as illustrated in FIG. 7, the chromaticity region 146 may be larger than and encompass the defined bin 150, such that the defined bin 150 is a subset of the chromaticity region 146. Although the chromaticity region 146 illustrated in FIG. 7 is a quadrangle, it will be appreciated that other geometric shapes may be used to define the chromaticity region. The chromaticity region 146 is further subdivided into a plurality of subregions 146A-146D, each of which may at least partially overlap the standard bin 150. However, subregions may be defined that do not overlap the standard bin 150. Light emitters 120A-120D having chromaticities within one or more of the defined subregions 146A-146D may then be selected for inclusion in an LED package.

The light emitters 120A-120D may, for example, have respective chromaticity points at the points indicated in FIG. 7. In the example of FIG. 7, the chromaticity point of light emitter 120A is within the subregion 146A, but is on the edge of the defined bin 150. The chromaticity point of the light emitter 120B is within the subregion 146B and within the desired bin 150. Similarly, the chromaticity point of the light emitter 120C is within the subregion 146C and within the desired bin 150. The chromaticity point of light emitter 120D is within the subregion 146D, but is outside the desired bin 150. However, the combined light emitted by all four light emitters 120A-120D may be within the desired bin 150, and may be within an even smaller target chromaticity region 148 that is within the defined bin 150.

In particular, for a chromaticity region 146 that is defined contiguous with an ANSI-specified bin, a target chromaticity region 148 can be obtained according to some embodiments that approximates a 4-step MacAdam ellipse, thereby providing significantly better color purity compared to a package that is simply specified as falling within the ANSI-specified bin.

In some embodiments, a chromaticity region is defined that encompasses a defined bin. The chromaticity region is divided into subregions, each of which at least partially overlaps the defined bin. Light emitters are selected from the subregions for inclusion within an LED package. For each of the defined subregions, there may be a complementary subregion that is arranged opposite a center point of the defined bin from the subregion. For example, referring to FIG. 7, subregions 146A and 146D are complementary subregions, since they are disposed opposite one another relative to a center point 145 of the defined bin 150, and subregions 146C and 146B are complementary subregions. In selecting light emitters for inclusion in an LED package 100, whenever a light emitter is selected from a subregion, a light emitter may also be selected from a complementary subregion for inclusion within a particular LED package 100.

By selecting light emitters from multiple defined subregions within a chromaticity region, the final combined light output by a packaged LED 100 may be more consistent (i.e. more tightly grouped) than if the light emitters had simply been selected from an arbitrary point within the chromaticity region. In some embodiments, it has been found that it is possible to obtain grouping of combined light chromaticities to within a four step, or even a two-step, MacAdam ellipse, which may provide an improvement of up to 79% or more relative to conventional bin sizes.

Figure 8A:
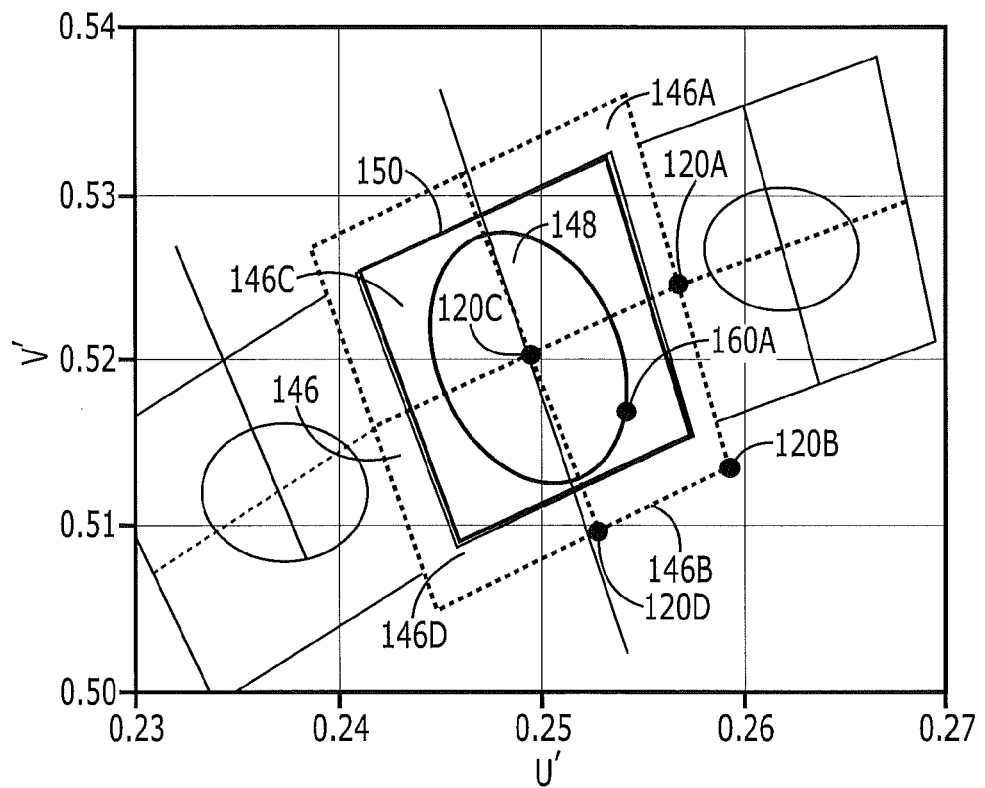
FIGS. 8A, 8B and 8C illustrate selection of light emitters from chromaticity regions that are subdivided into subregions according to some embodiments.

In general, the target chromaticity region 148 can be determined as the union of all possible chromaticity points of light that is generated by a combination of one light emitter from each of the subregions 146A-146D. Thus, the outer perimeter of the target chromaticity region 148 can be determined by combining light from four different light emitters at the extreme points of the respective subregions 146-146D. For example, referring to FIG. 8A, assuming equal luminous flux, light emitters 120A-120D having chromaticity points at the extreme positions shown therein will generate combined light having a chromaticity point 160A. That is, for a selection of one light emitter from each of the four defined subregions 146A to 146D, FIG. 8A represents a worst-case or most extreme scenario of chromaticity points for the four light emitters. However, as illustrated in FIG. 8A, the chromaticity point 160A of the combined light may still fall well within the defined bin 150

Figure 8B:
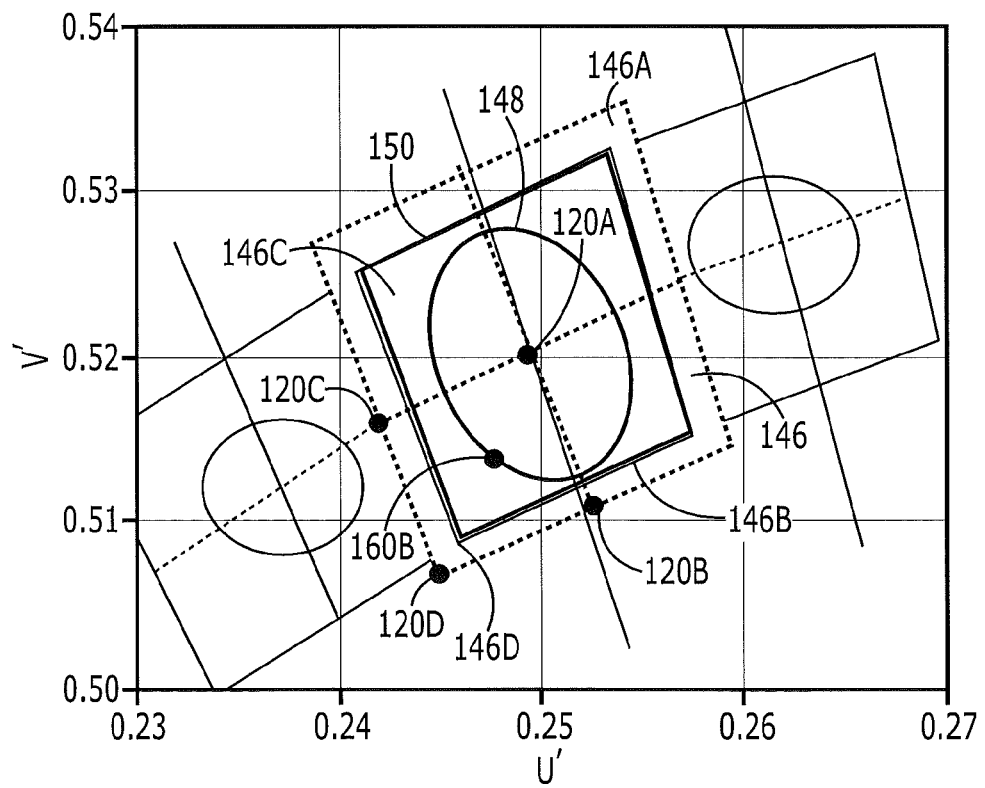

Similarly, referring to FIG. 8B, assuming equal luminous flux, light emitters 120A-120D having chromaticity points at the extreme positions shown therein will generate combined light having a chromaticity point 160B, which is still within the defined bin 150. Taking all possible combinations of four light emitters from the four different subregions 146A to 146D will define the target chromaticity region 148 as a region of all possible chromaticity points of combined light that can be obtained from a combination of light emitters including one light emitter from each of the subregions 146A-146D.

Figure 8C:
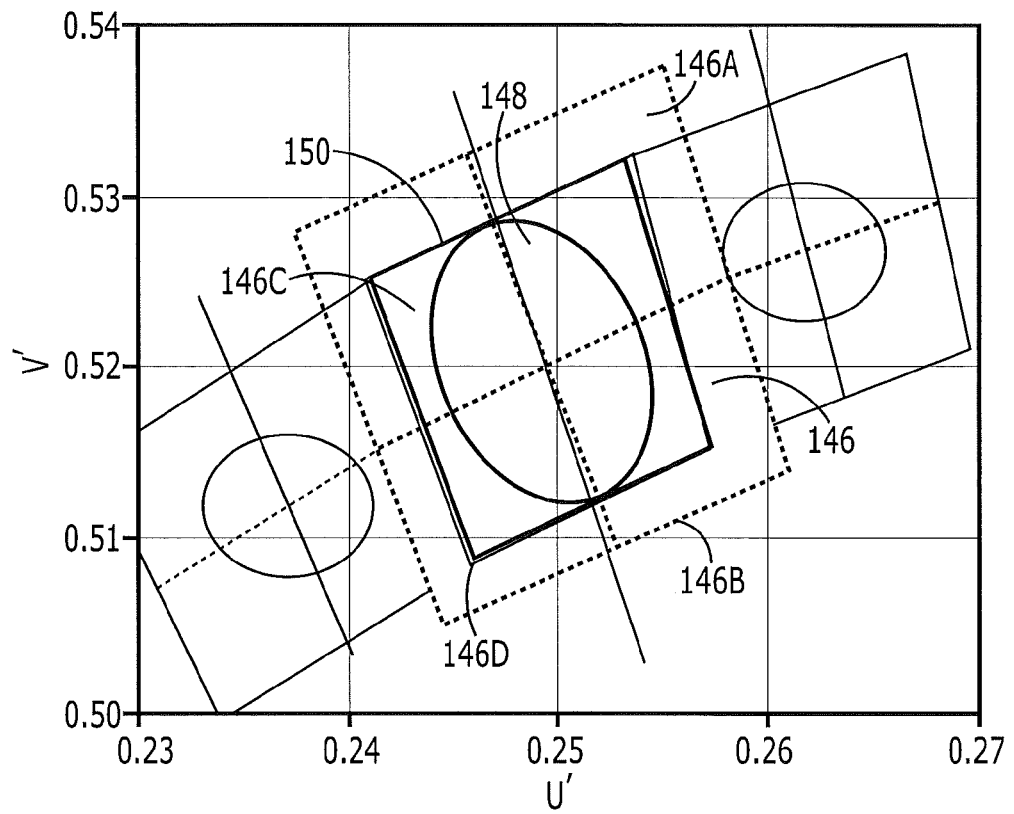

In some particular embodiments, the size of the chromaticity region 146, which can be used to define the bins 146A-146D from which light emitters are selected, can be determined so that any combination of light emitters from the four different subregions 146A-146D will not generate combined light having a chromaticity point that falls outside the defined bin 150. That is, the size of the chromaticity region 146 can be selected so that the target chromaticity region 148 touches an edge of the defined bin 150, as illustrated in FIG. 8C.

Thus, according to some embodiments, an LED package 100 can generate combined light having a chromaticity that is inside a desired bin even though the package 100 includes one or more light emitters having chromaticities outside the desired bin. This approach can provide significant flexibility to an LED package manufacturer, because it enables the use of larger bins of light emitters than was previously possible. This can reduce waste and inefficiency in the packaging process, because there may be fewer unusable parts compared to a manufacturing process in which only light emitters from a defined bin are selected for inclusion in a package designed to emit light having a color point within the region occupied by the defined bin.

Figure 9:
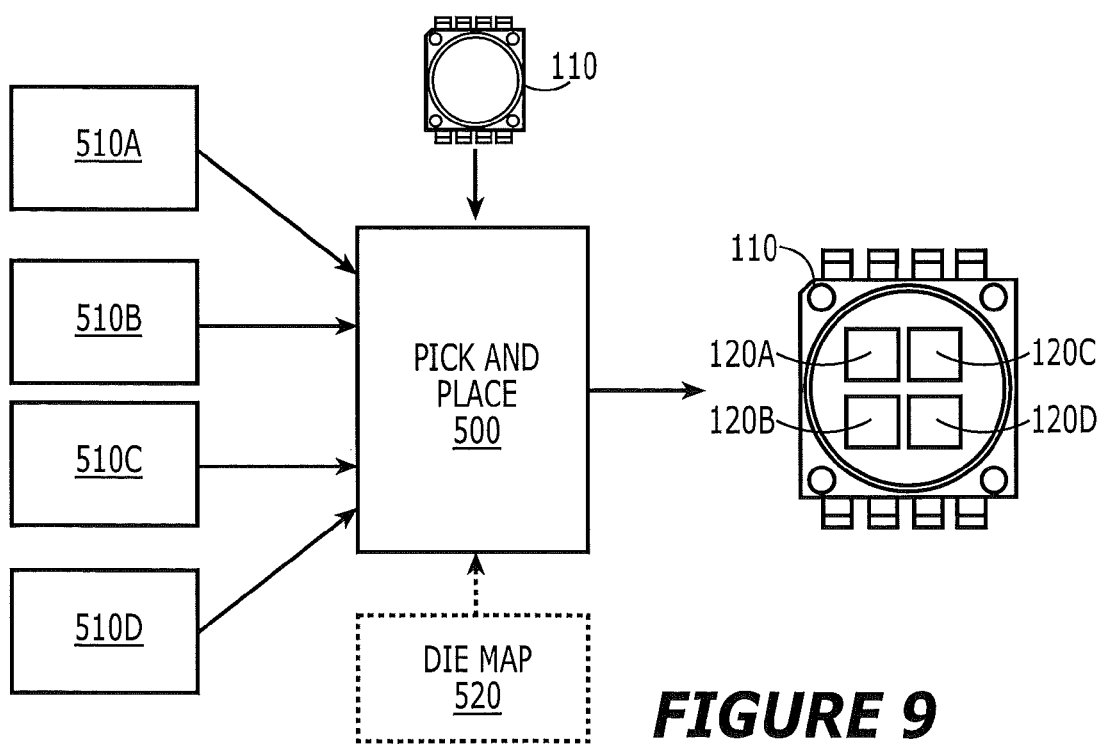
FIG. 9 schematically illustrates a system for assembling light emitting diode packages according to some embodiments.

A system for assembling LED packages according to some embodiments is illustrated in FIG. 9. As shown therein, a pick and place device 500 is configured to accept a plurality of die sheets 510A to 510D. Each of the die sheets 510A to 510D includes light emitters 120A to 120D that emit light that falls within one of the subregions 146A to 146D of the chromaticity region 146. For example, light emitters 120A on the die sheet 510A may emit light that falls within the first subregion 146A of the chromaticity region 146, light emitters 120B on the die sheet 510B may emit light that falls within the second subregion 146B of the chromaticity region 146, etc.

In some embodiments, the pick and place device 500 may accept a single die sheet 510A that includes light emitters from each of the subregions 146A-146D along with an electronic die map 520 containing information about the chromaticities of the various die on the die sheet 510A.

In some embodiments, one or more of the die sheets 510A-510D may contain light emitters that include LED die that have been coated with a phosphor containing material.

The pick and place device 500 also receives a plurality of package bodies 110, for example on a tape reel. The pick and place device 500 may select one light emitter 120A-120D from each of the die sheets 510A-510D and mount it on a single package body 110. The package body 110 including the four light emitters 120A-120D is then output by the pick and place device 500 to a subsequent processing device, for example, to coat the light emitters 120A-120D with an encapsulant, to affix a lens onto the package body 110, or to perform some other action.

Accordingly, a manufacturing process according to some embodiments can facilitate efficient assembly of an LED package 100 that includes light emitters selected to generate a combined light that falls within a target chromaticity region.

In addition to chromaticity, luminous flux may be considered in grouping the light emitters 120. For example, reference is now made to FIG. 10, which is a table illustrating luminous flux bin values according to some embodiments of the present invention. The light emitters 120 may be grouped according to their luminous flux using multiple luminous flux ranges. For example, three luminous flux bins identified as V1, V2, and V3 may correspond to ranges 100 lm to 110 lm, 110 lm to 120 lm, and 120 lm to 130 lm, respectively. In this manner, emitter groups may be defined as falling within a specific chromaticity subregion at a specific luminous flux range. For example, an emitter group may include all light emitters 120 having chromaticity corresponding to chromaticity subregion 146C and luminous flux V2. Thus, the light emitters 120 may be grouped responsive to a combined chromaticity of a portion of multiple bins that may be defined corresponding to multiple chromaticity regions and multiple luminous flux ranges.

Figures 10, 11:
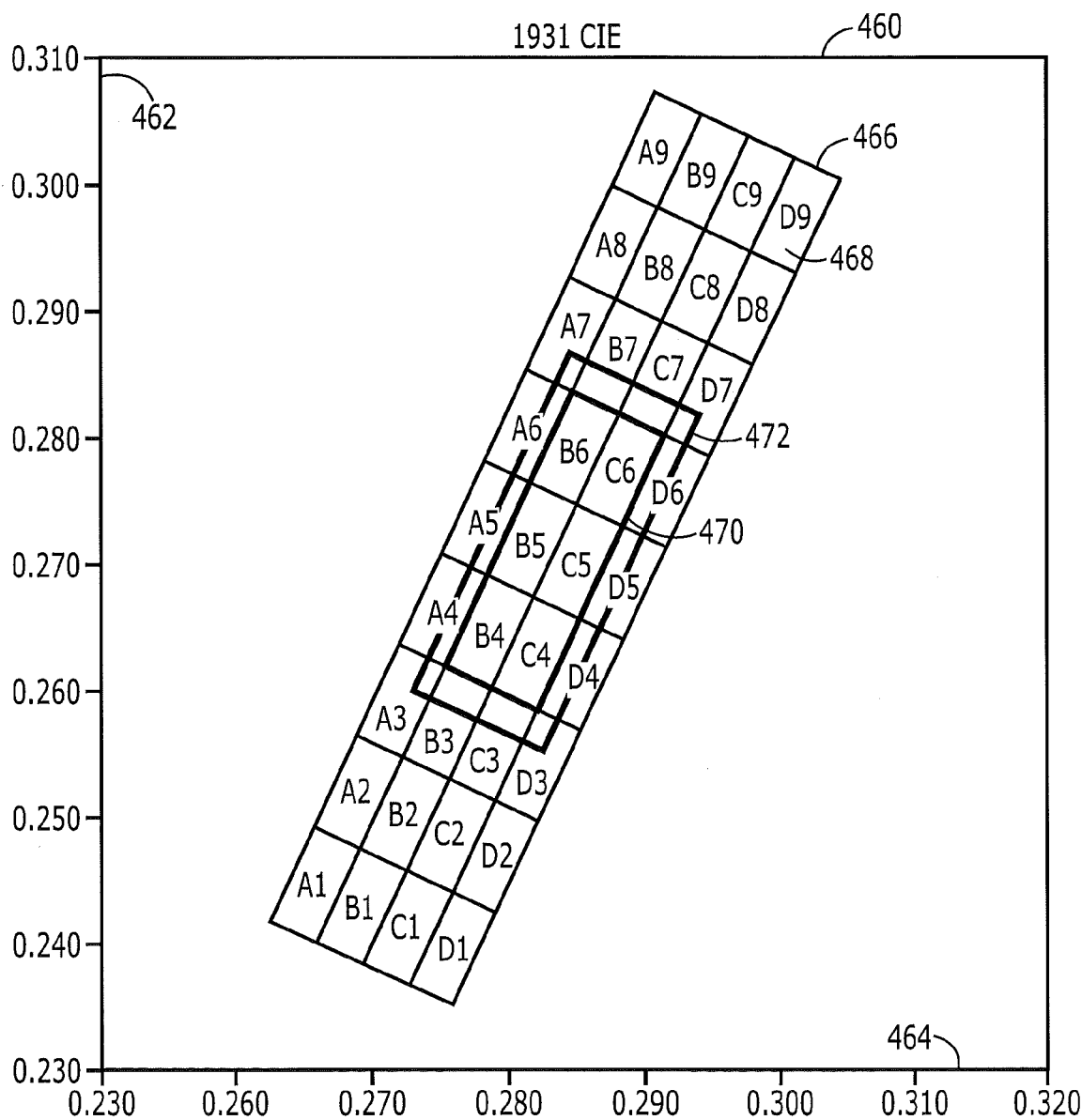
FIG. 10 illustrates luminous flux bins that can be used in accordance with some embodiments.
FIG. 11 illustrates a portion of a chromaticity space including a plurality of chromaticity regions including a target chromaticity region according to some embodiments.

Reference is now made to FIG. 11, which is a chromaticity diagram illustrating multiple chromaticity regions and a target chromaticity region according to some embodiments of the present invention. A portion of 1931 CIE chromaticity space 460 includes an x axis 464 and a y axis 462. Light emitters 120 may be sorted into multiple chromaticity subregions 468 according to the chromaticity of light emitted therefrom. In some embodiments, the chromaticity regions 468 may fall within a region that is generally considered to constitute white light. A target chromaticity region 470 may include a portion of the chromaticity region 460 that is specified corresponding to a design specification and/or a particular application. In some embodiments, the target chromaticity region 470 may be expressed in terms of chromaticity coordinates. In some embodiments, a tolerance color region 472 may be larger than the target chromaticity region 470 due to variations between individual emitters within each of the subregions 468.

In some embodiments, each of the emitter group regions 468 may include a center point that may be determined as a function of chromaticity values. Some embodiments provide that, within each bin, the emitters may be further grouped corresponding to luminous flux. In this regard, each of the bins may be expressed, for example, in terms of x, y, and Y, such that chromaticity of each of the bins may be expressed as center point x, y coordinates and the luminous flux may be expressed as Y.

A combined chromaticity corresponding to emitters from two bins may be determined using the chromaticity and luminous flux center point values corresponding to the two bins. For example, the combined chromaticity component values for mixing two bins, bin 1 and bin 2, may be calculated as:

$$x = \frac{x1*m1 + x2*m2}{m1 + m2}; \text{ and } y = \frac{y1*m1 + y2*m2}{m1 + m2},$$

such that x1 and y1 are chromaticity center point values of bin 1, and x2 and y2 and chromaticity center point values of bin 2. Intermediate values m1 and m2 may be used to incorporate the center point luminous flux values Y1 and Y2 of bins 1 and 2, respectively, into the combined chromaticity component values and may be determined as:

$$m1 = \frac{Y1}{y1}; \text{ and } m2 = \frac{Y2}{y2}.$$

In some embodiments, a combined luminous flux corresponding to the combination of bins 1 and 2 may be determined as:

$$Y = Y1 + Y2.$$

In some embodiments, combinations that produce a luminous flux below a specified range may be discarded. In some embodiments, the luminous flux values of the bins are such that a combined luminous flux is necessarily within a specified range. For example, if the minimum bin luminous flux is V1 and the specified range includes V1 luminosities, then all of the combinations necessarily are within the specified range. Although the disclosure herein specifically addresses two bin combinations, the invention is not thus limited. For example, combinations including three or more bins may also be used according to the methods, devices and apparatus disclosed herein.

After filtering out combinations based on luminous flux, if necessary, the combined chromaticity of each two-bin combination may be compared to a target chromaticity region 470 to determine which of the combinations to discard. For example, if a combined chromaticity is located in emitter group region A3 then that combination may be discarded. In this manner, the combinations that provide sufficient luminous flux and chromaticity may be considered when selecting the light emitters 120 from corresponding ones of those bins.

In some embodiments, the multiple bins may be prioritized based on, for example, proximity to the target chromaticity region 470. For example, bins that are farther from the desired color region may be assigned a higher priority than bins that are nearer to the desired color region. In this manner, subregion A9 may be assigned a higher priority than subregion C3. In some embodiments, combination center points may then be prioritized corresponding to the bin priorities.

Some embodiments provide that the combination center points may be prioritized based on locations of the combination center points relative to a target chromaticity point in the target chromaticity region 470. In some embodiments, the target chromaticity may be dependent on the geometry of desired color region, such as, for example, a center and/or other focus point of the target chromaticity region 470. In some embodiments, the light emitters 120 are selected from a batch or inventory of light emitters that are grouped into the bins and the target chromaticity point may correlate to chromaticity and/or luminous flux data of the emitter inventory.

Selection and combination of light emitting devices may be performed according to the methods described in U.S. patent application Ser. No. 12/057,748, filed Mar. 28, 2008, the disclosure of which is incorporated herein as if fully set forth in its entirety.

Figure 12:
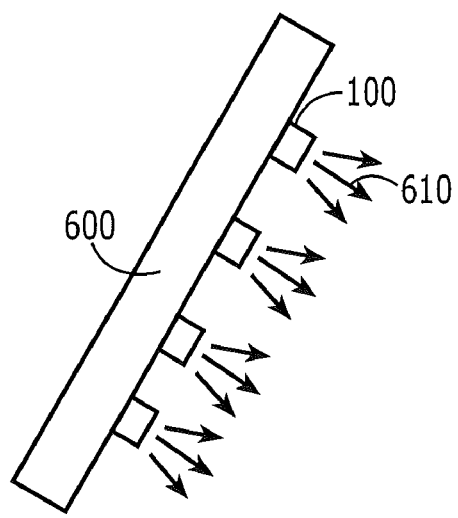
FIG. 12 illustrates a lighting panel for general illumination including a plurality of light emitting device packages according to some embodiments.

Referring to FIG. 12, a lighting panel 600 includes a plurality of LED packages 100 as described herein that are mounted on a first side of the panel 600 and that emit light combined 610 having a chromaticity within a target chromaticity region for use in general lighting applications.

Figure 13:
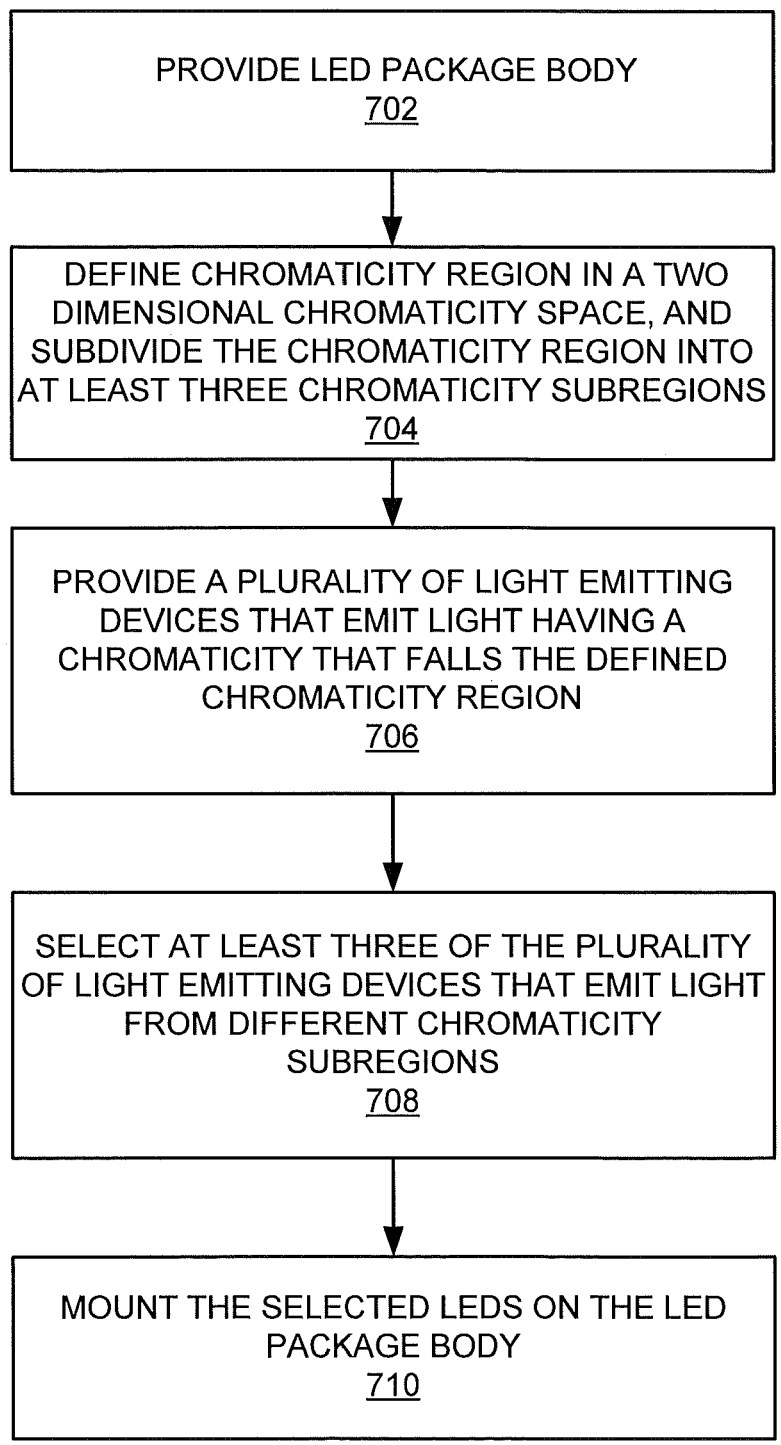
FIG. 13 is a flowchart illustrating operations of systems and/or methods according to some embodiments.

FIG. 13 is a flowchart illustrating operations according to some embodiments. As illustrated therein (with further reference to FIG. 7), methods of forming a light emitting device package assembly according to some embodiments include providing a light emitting device package body (Block 702), defining a chromaticity region in a two dimensional chromaticity space and subdividing the defined chromaticity region into at least three chromaticity subregions (Block 704), and providing a plurality of light emitting devices that emit light having a chromaticity that falls within the defined chromaticity region (Block 706). At least three of the plurality of light emitting devices are selected for mounting on the light emitting device package body, wherein each of the three light emitting devices emits light from a different one of the chromaticity subregions (Block 708). Finally, the selected LEDs are mounted on the package body (Block 710)

The methods may further include defining a second chromaticity region in a two dimensional chromaticity space and subdividing the second chromaticity region into at least three second chromaticity subregions, providing a second plurality of light emitting devices that emit light having a chromaticity that falls within at least one of the second chromaticity subregions, and selecting at least three of the second plurality of light emitting devices, wherein each of the three light emitting devices of the second plurality of light emitting devices emits light from a different one of the second chromaticity subregions. The selected light emitting devices of the second plurality of light emitting devices are mounted on the light emitting device package body. Accordingly, the operations illustrated in Blocks 702 to 710 of FIG. 13 can be repeated and/or performed concurrently for a second or subsequent chromaticity regions.

As discussed above, the defined subregions may include a plurality of pairs of complementary subregions with respective subregions in a pair of complementary subregions arranged opposite a center point of the chromaticity region from one another. The methods may further include selecting at least four of the plurality of light emitting devices from at least four chromaticity subregions in pairs from respective pairs of complementary subregions.

Furthermore, the methods may include selecting a first light emitting device having a first luminous flux from a first subregion that has a center point that is located a first distance from a center point of the chromaticity region, and selecting a second light emitting device having a second luminous flux from a second subregion that is complementary to the first subregion and that has a center point that is located a second distance from a center point of the chromaticity region. The first distance may be smaller than the second distance and the first luminous flux may be larger than the second luminous flux, so that combined light emitted by the pair of light emitting device from complementary subregions may fall within the target chromaticity region, as illustrated in FIG. 11.

Figure 14:
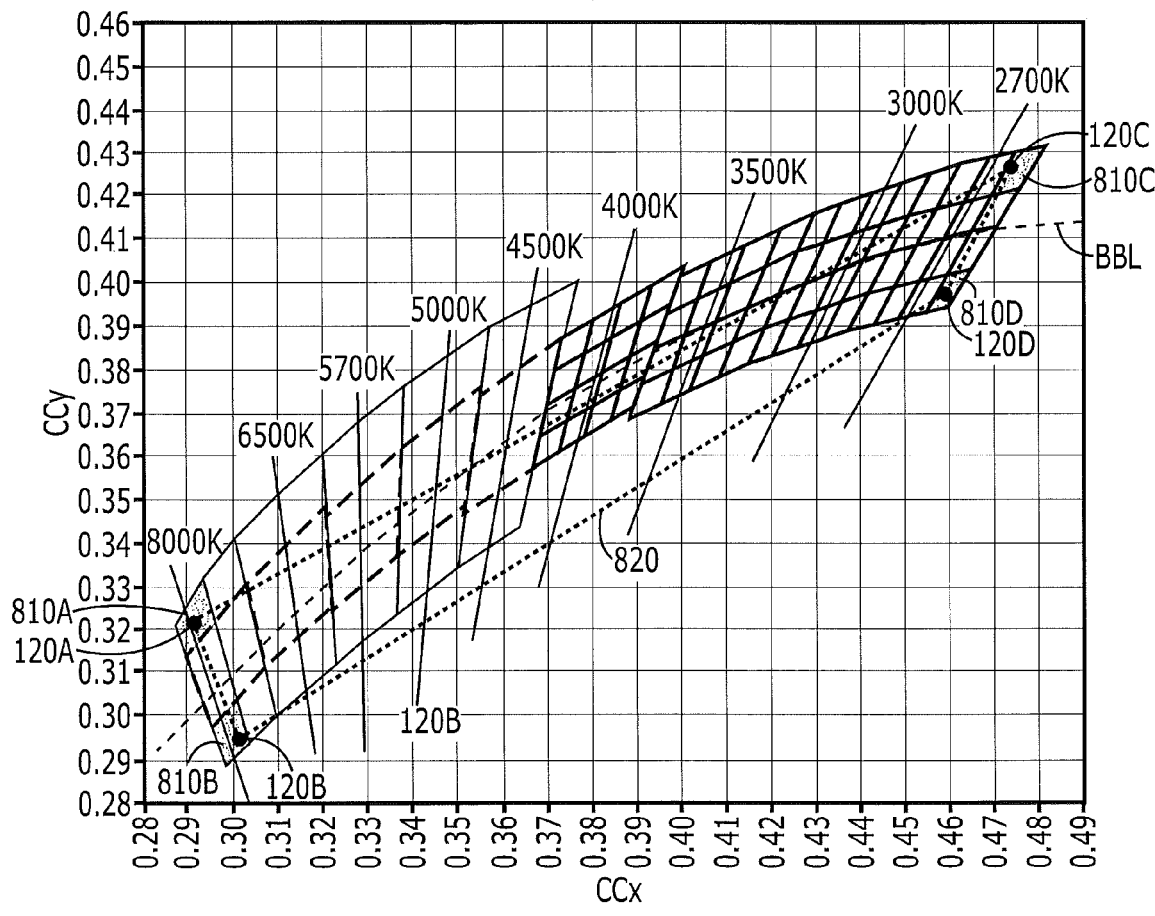
FIGS. 14, 15 and 16 illustrate a plurality of chromaticity regions on a 1931 CIE chromaticity diagram according to some embodiments.
Figure 15:
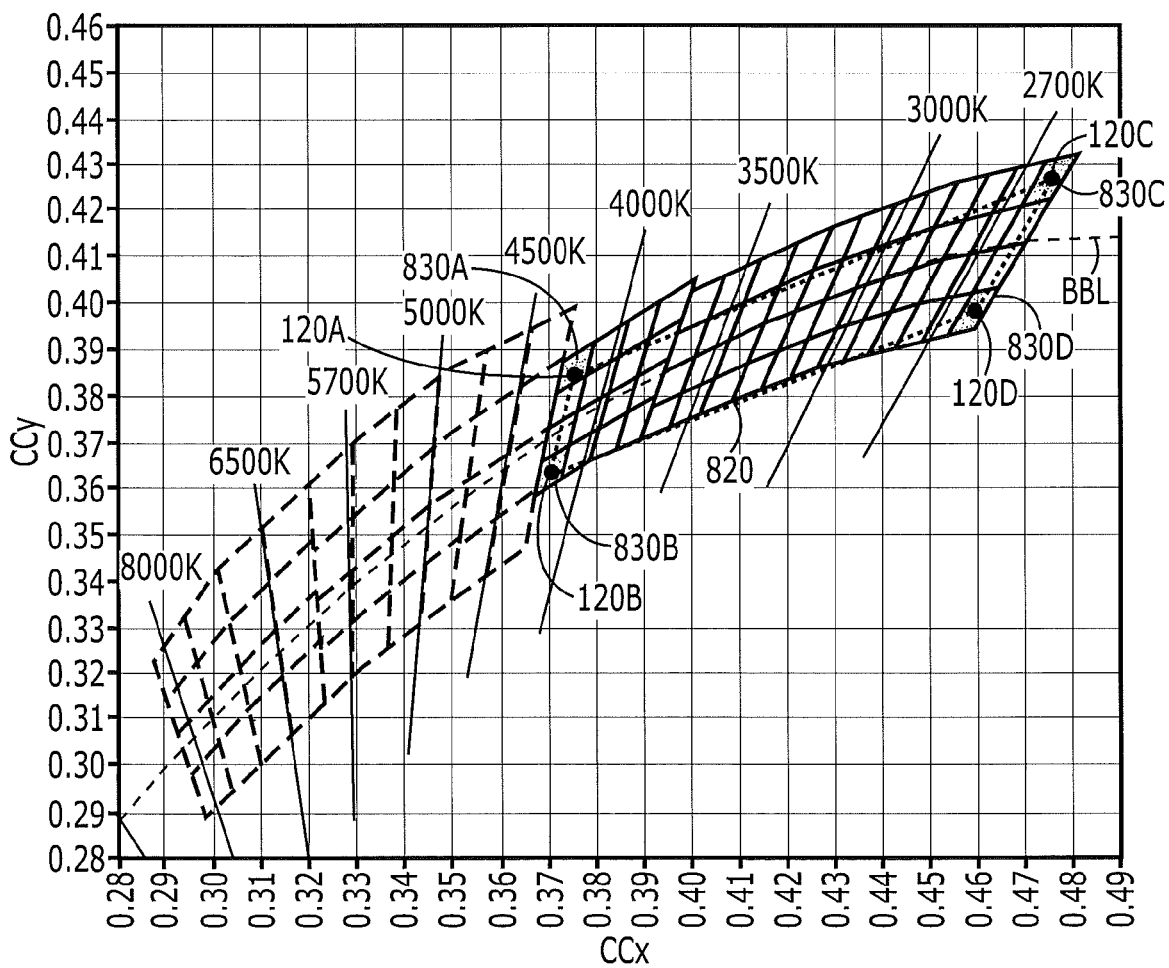
Figure 16:
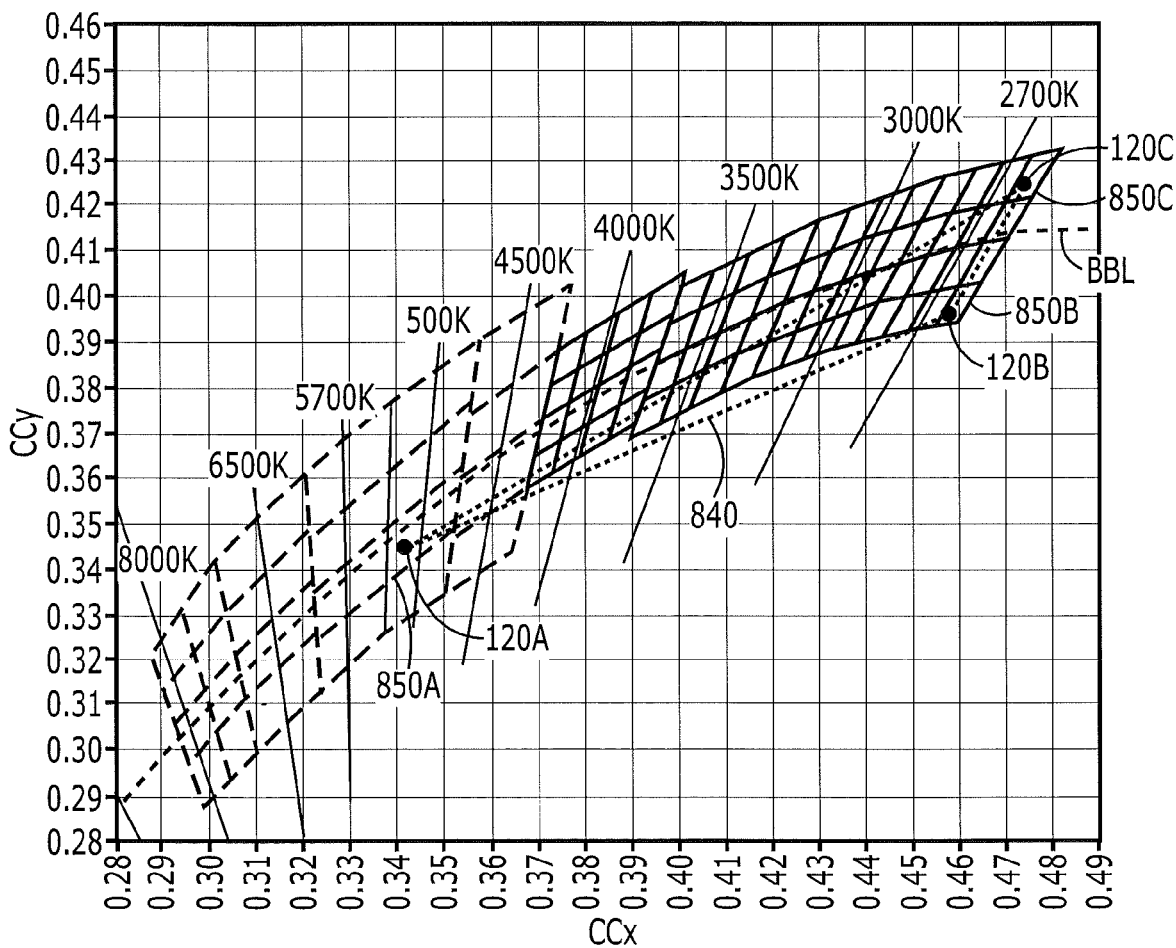

Further embodiments of the invention are illustrated in FIGS. 14-16. These embodiments arise from a realization that a white LED package assembly having a tunable color point can be formed by providing a plurality of light emitting devices having chromaticities that fall within different chromaticity regions and separately controlling the plurality of light emitting devices to emit light at different intensities. For example, a single luminaire may include light emitting devices that are binned in different "white" bins, which may include both warm and cold white bins. In particular embodiments, differently-binned light emitting devices can be provided in a single LED package assembly and/or separate LED package assemblies in a luminaire. Furthermore, a luminaire according to some embodiments can include a plurality of strings of LEDs, wherein each of the strings includes LEDs from a same chromaticity region, and different strings emit light in different ones of the chromaticity regions.

Chromaticity of the combined light emitted by a single package assembly and/or luminaire assembly including differently binned LEDs can be tuned to fall within a chromaticity region defined by the chromaticity points of the LEDs in the assembly by adjusting the relative intensity of light emitted by the LEDs.

For example, referring to FIG. 14, which illustrates a plurality of possible chromaticity regions as represented on a 1931 CIE chromaticity diagram, four chromaticity regions, or bins, 810A to 810D are identified. An LED package assembly, such as the LED package assembly 100 shown in FIG. 1A may include four white light emitting LEDs 120A-120D, in which respective ones of the LEDs 120A to 120D are selected from LEDs falling within the four chromaticity regions 810A to 810D shown in FIG. 14. For example, LED 120A may emit light when energized that falls within chromaticity region 810A, LED 120B may emit light when energized that falls within chromaticity region 810B, LED 120C may emit light when energized that falls within chromaticity region 810C, and LED 120D may emit light when energized that falls within chromaticity region 810D. Color points of the LEDs 120A to 120D are illustrated in FIG. 14. Each of the chromaticity regions 810A to 810D may have a size that is about equal to a seven step MacAdam ellipse.

The four chromaticity regions 810A to 810D may be spaced apart from one another in the two-dimensional chromaticity space to define a tuning region 820 illustrated as a polygon formed with the specific color points of the LEDs 120A to 120D as the vertices of the polygon. In particular, the four chromaticity regions 810A to 810D may be spaced apart from one another by respective regions that are at least the size of a seven step MacAdam ellipse. Stated differently, a region between any two of the chromaticity regions 810A to 810D may be at least large enough that a seven step MacAdam ellipse can fit therein. In some embodiments, the four chromaticity regions 810A to 810D may be spaced apart from one another by respective regions that are at least the size of a fourteen step MacAdam ellipse, and in still further embodiments, the four chromaticity regions 810A to 810D may be spaced apart from one another by respective regions that are at least the size of a twenty step MacAdam ellipse.

By varying the relative intensity of light emitted by the LEDs 120A to 120D, the color point of the package assembly 100 can be shifted to any point within the tuning region 820. The intensity of the light emitted by any one of the LEDs 120A to 120D can be varied by adjusting the average current passing through the LEDs. Adjusting the average level of current passing through LEDs 120A to 120D can be performed by adjusting a steady state level of DC current passing through the LEDs. In some embodiments, the average level of current passing through an LED can be adjusted by adjusting the duty cycle of a pulse width modulation (PWM) and/or pulse frequency modulation (PFM) drive current that is passed through the LEDs.

As will be appreciated, the light output characteristics of an LED may change in response to changes in the level of DC current supplied to the device. For example, an LED driven at 20 mA may have a different chromaticity point than when the same LED is driven at 100 mA. Accordingly, it may be desirable to drive the LED using a pulse width modulated drive current that switches between a maximum DC current level and zero, so that when the average current level is changed (for example by varying the duty cycle of the drive current), the chromaticity point of the LED does not change.

Referring still to FIG. 14, the tuning region 820 may include chromaticity regions that are generally considered to be "white" (i.e., the regions enclosed in polygons) and may also include some non-white regions.

The chromaticity regions 810A to 810D include two "cool white" regions 810A and 810B and two "warm white" regions 810C and 810D. (It will be appreciated that the terms "warm white" and "cool white" are based on the appearance of the light to an observer, not on the correlated color temperature (CCT) of the light. Thus, warm white light, which appears more reddish, has a lower CCT than cool white light, which appears more bluish.)

Referring again to FIG. 1A, the two warm LEDs 120A and 120B may be positioned in the package 100 diagonally opposite one another, while the two cool LEDs 120C and 120D may be positioned in the package 100 diagonally opposite one another, which may balance or equalize the far-field emission characteristics of the package so that the combined light observed in the far field will appear to be a homogeneous mixture of warm and cool light.

In the embodiments illustrated in FIG. 14, the two cool white LEDs 120A, 120B have CCTs that are greater than 5000K, and in particular are greater than 5700K, and even more particularly are greater than 6500K. The two warm white LEDs 120C, 120D, have CCTs that are less than 5000K, and in particular are less than 3500K, and even more particularly are less than 3000K. Furthermore, the two cool white LEDs 120A, 120B have chromaticity points on opposite sides of the black body locus BBL from one another. Similarly, the two warm white LEDs 120C, 120D have chromaticity points on opposite sides of the black body locus from one another.

Accordingly, the tuning region 820 may enclose at least some portions of the black body locus. Furthermore, the combined light emitted by the LEDs 120A to 120D can have a correlated color temperature that is tunable from less than about 2700K to greater than about 6500K or more.

In some particular embodiments, none of the chromaticity regions 810A to 810D may overlap the black body locus. However, the tuning region defined by particular LEDs having color points within the chromaticity regions 810A to 810D may enclose at least a portion or portions of the black body locus. Furthermore, combined light emitted by the LEDs 120A to 120D may fall within a 7-step MacAdam ellipse of a point on the black body locus.

In some particular embodiments, the first and second chromaticity regions 810A, 810B include light having x, y color coordinates within an area on a 1931 CIE Chromaticity Diagram defined by points having coordinates of (0.3080, 0.3110), (0.3010, 0.3420), (0.3290, 0.3690), and (0.3290, 0.3300). The third and fourth chromaticity regions 810C, 810D may include light having x, y color coordinates within an area on a 1931 CIE Chromaticity Diagram defined by points having coordinates of (0.4373, 0.3893), (0.4562, 0.4260), (0.4813, 0.4319), and (0.4593, 0.3944).

Independent driving of LEDs in a package assembly 100 may be obtained by providing at least one isolated lead for each LED in the package assembly, as illustrated in FIG. 1A. Individual drive and/or control circuitry may be provided within the luminaire for each LED in the package. Furthermore, corresponding LEDs in different packages may be connected in respective series strings (as shown in FIG. 4D) that can be driven by individual drive/control circuitry in the luminaire.

Further embodiments are illustrated in FIG. 15, in which a plurality of possible chromaticity regions, as represented on a 1931 CIE chromaticity diagram, are illustrated to include four chromaticity regions 830A to 830D. LEDs 120A to 120D have chromaticity points that fall within respective ones of the chromaticity regions 830A to 830D and define a tuning region 840. As illustrated in FIG. 15, each of the chromaticity regions 830A to 830D may include light having a CCT that is less than 5000K, and in some embodiments may include light having a CCT that is less than 4500K. Such an embodiment may be referred to as a tunable warm white device or apparatus.

In other embodiments, all of the chromaticity regions may include light having a CCT that is greater than 4000K. Such an embodiment may be referred to as a tunable cool white device or apparatus.

In some embodiments, all of the chromaticity regions may include light having a CCT between 2700K and 5000K.

Still further embodiments are illustrated in FIG. 16, in which a plurality of possible chromaticity regions, as represented on a 1931 CIE chromaticity diagram, are illustrated to include three chromaticity regions 850A to 850C. LEDs 120A to 120C have chromaticity points that fall within respective ones of the chromaticity regions 830A to 830C and define a triangular tuning region 860. The first LED 120A may have a chromaticity point that falls within a chromaticity region 850A that encompasses a portion of the black body locus BBL.

Furthermore, the two LEDs 120B, 120C have chromaticity points on opposite sides of the black body locus BBL from one another.

In still further embodiments, the LEDs 120A to 120D in an LED package assembly may include LEDs having different color rendering characteristics. For example, referring to FIG. 1A, at least one of the LEDs 120A to 120D may have a relatively low color rendering index (CRI) (e.g., less than 85), while at least one other of the LEDs 120A to 120D may have a relatively high CRI (e.g., greater than 85). In some embodiments, two of the LEDs may have a CRI less than 85 and two of the LEDs may have a CRI greater than 85.

In further embodiments, a first plurality of LEDs in a package may have an average CRI that is about 10 points greater than an average CRI of a second plurality of LEDs in the package.

In some further embodiments, two of the LEDs in a package assembly may have a CRI of about 90 and two of the LEDs in the package assembly may have a CRI of about 80, in which case an average CRI of the combined light emitted by the LED package assembly when energized may be about 85.

In still further embodiments, a first plurality of LEDs in a solid state lighting apparatus may have an average CRI that is about 10 points greater than an average CRI of a second plurality of LEDs in the apparatus.

It will be appreciated that high CRI devices are typically relatively dimmer than low CRI devices, which may be due to the inclusion of more phosphor material in the high CRI device. Thus, in some respects, there may be a tradeoff between brightness and CRI for some types of solid state devices. By mixing low CRI devices with high CRI devices in a single LED package assembly, a combined light emitted by the package may have reasonably high brightness and reasonably high CRI. Furthermore, because brightness of the devices may be independently controlled in some embodiments as described above, the high CRI devices may be driven at higher average current than the low CRI devices to offset the loss of brightness associated with the increase in CRI.

Some embodiments of the invention provide a lighting panel having two or more strings of LED chips connected in electrical series, as illustrated in FIG. 4D. An independent current control circuit may be provided for each of the strings of LED chips. Furthermore, current to each of the strings may be individually controlled, for example, by means of pulse width modulation (PWM) and/or pulse frequency modulation (PFM). The width of pulses applied to a particular string in a PWM scheme (or the frequency of pulses in a PFM scheme) may be based on a pre-stored pulse width (frequency) value that may be modified during operation based, for example, on a user input and/or a sensor input.

Figure 17:
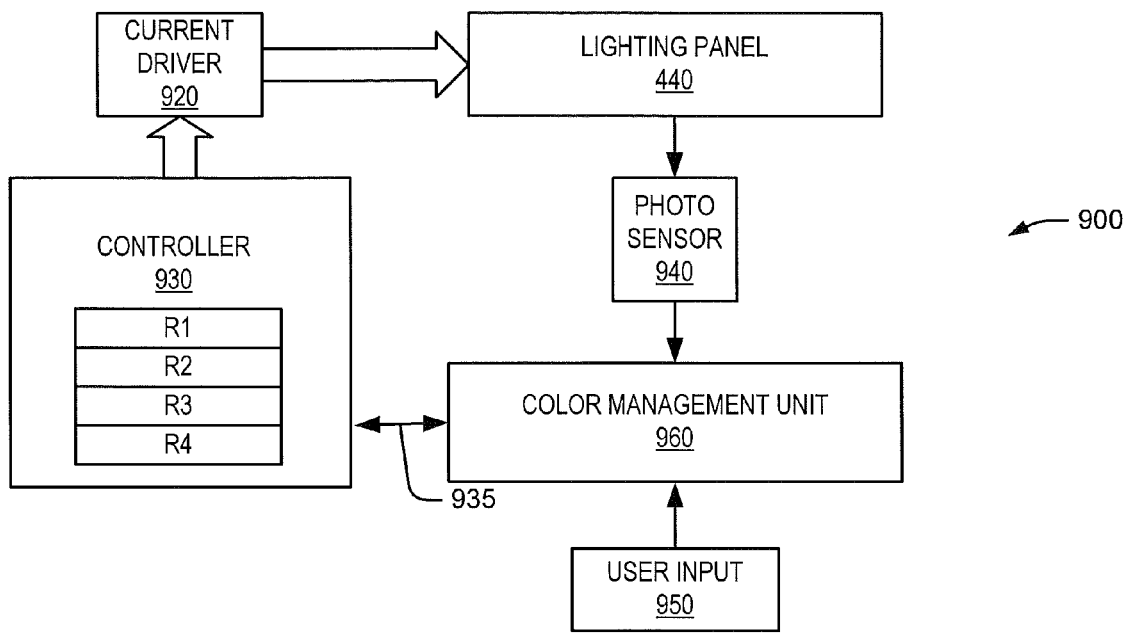
FIGS. 17 and 18 illustrate electrical components of a luminaire according to some embodiments.

Referring to FIG. 17, a luminaire 900 according to some embodiments of the invention is shown. The luminaire 900, which may be a lighting fixture for general illumination, includes a lighting panel 440, which may, for example, include a circular panel provided within a recess can light as illustrated in FIG. 4C. The panel 440 may include first to fourth strings of white light emitting diodes 423A to 423D each of which may include LEDs selected from respective bins corresponding to chromaticity regions as illustrated in FIG. 14. For example, a first string 423A may include LEDs 120A selected from a first chromaticity region or bin 810A, a second string 423B may include LEDs 120B selected from a second chromaticity region or bin 810B, and so on.

A current driver 920 provides independent current control for each of the LED strings 923 of the lighting panel 940. The current driver 920 may provide a constant current source for each of the LED strings of the lighting panel 440 under the control of a controller 930. In some embodiments, the controller 930 may be implemented using an 8-bit microcontroller such as a PIC18F8722 from Microchip Technology Inc., which may be programmed to provide pulse width modulation (PWM) control of separate current supply blocks within the driver 920 for the LED strings 423A to 423D.

Pulse width information for each of the LED strings may be obtained by the controller 930 from a color management unit 960, which may in some embodiments include a color management controller such as the Agilent HDJD-J822-SCR00 color management controller.

The color management unit 960 may be connected to the controller 930 through an I2C (Inter-Integrated Circuit) communication link 935. The color management unit 960 may be configured as a slave device on an I2C communication link 935, while the controller 930 may be configured as a master device on the link 935. I2C communication links provide a low-speed signaling protocol for communication between integrated circuit devices. The controller 930, the color management unit 960 and the communication link 935 may together form a feedback control system configured to control the light output from the lighting panel 440. The controller 930 may include registers R1-R4, which may correspond to internal registers in the controller 930 and/or may correspond to memory locations in a memory device (not shown) accessible by the controller 930.

The controller 930 may include a register for each LED string 423A-423D. Each of the registers is configured to store pulse width information for a corresponding one of the LED strings 423A-423D. The initial values in the registers may be determined by an initialization/calibration process. However, the register values may be adaptively changed over time based on user input 950 and/or input from one or more photosensors 940 coupled to the lighting panel 440. The photosensor 940 may include, for example, an Agilent HDJD-S831-QT333 tricolor photo sensor.

Sensor outputs from the photosensor 940 may be provided to the color management unit 960, which may be configured to sample such outputs and to provide the sampled values to the controller 930 in order to adjust the register values for corresponding LED strings 423A-423D in order to adjust light output on a string-by-string basis.

The user input 950 may be configured to permit a user to selectively adjust a desired attribute of the lighting panel 440, such as color temperature, chromaticity point, etc., by means of user controls, such as input controls on a remote control panel.

Figure 18:
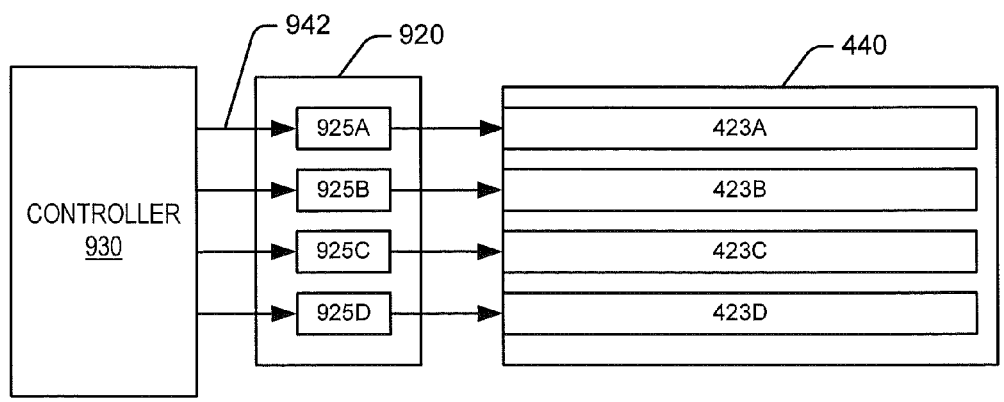

Referring now to FIG. 18, a current driver 920 may include a plurality of driver circuits 925A-925D. One driver circuit 925A-925D may be provided for each string 423A-423D in a lighting panel 440. Operation of the current supply circuits 925A-925B may be controlled by control signals 942 from the controller 930.

Accordingly, methods of operating a solid state luminaire according to some embodiments include independently controlling current through respective first, second and third strings of white light emitting diodes to generate combined white light having a chromaticity point that is within a tuning region defined by first, second and third chromaticity regions from which LEDs of the respective strings are selected. The methods may further include measuring the chromaticity of the combined light, and altering current through at least one of the first, second and third strings of white light emitting diodes in response to the measured chromaticity to cause the luminaire to emit combined light having a desired chromaticity.

Figure 19:
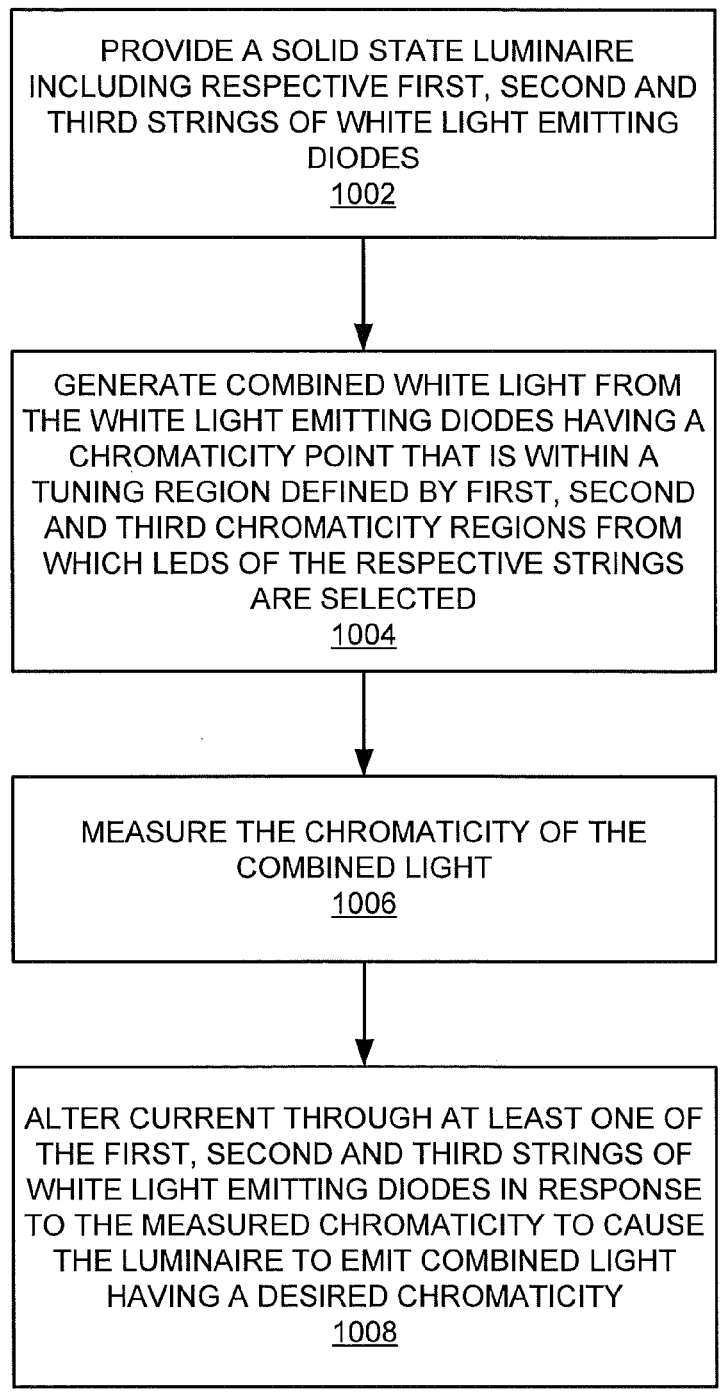
FIG. 19 is a flowchart illustrating operations of systems and/or methods according to some embodiments.

Methods according to some embodiments are illustrated in FIG. 19. As shown therein, the methods may include providing a solid state luminaire including respective first, second and third strings of white light emitting diodes (Block 1002), and generating combined white light from the white light emitting diodes having a chromaticity point that is within a tuning region defined by first, second and third chromaticity regions from which LEDs of the respective strings are selected (Block 1004). Chromaticity of the combined light is measured (Block 1006), and the methods further include altering current through at least one of the first, second and third strings of white light emitting diodes in response to the measured chromaticity to cause the luminaire to emit combined light having a desired chromaticity (Block 1008).

Figure 20:
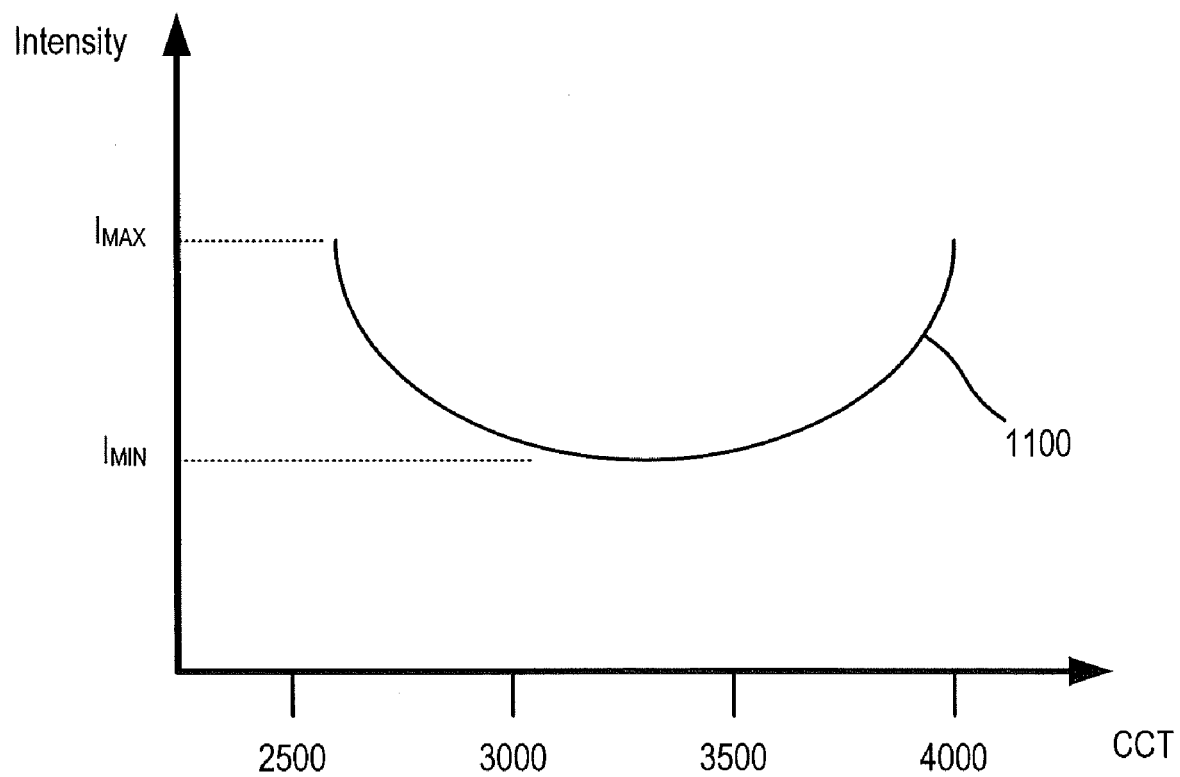
FIG. 20 illustrates variation of intensity of light output for light emitting devices according to some embodiments.
Figure 13:
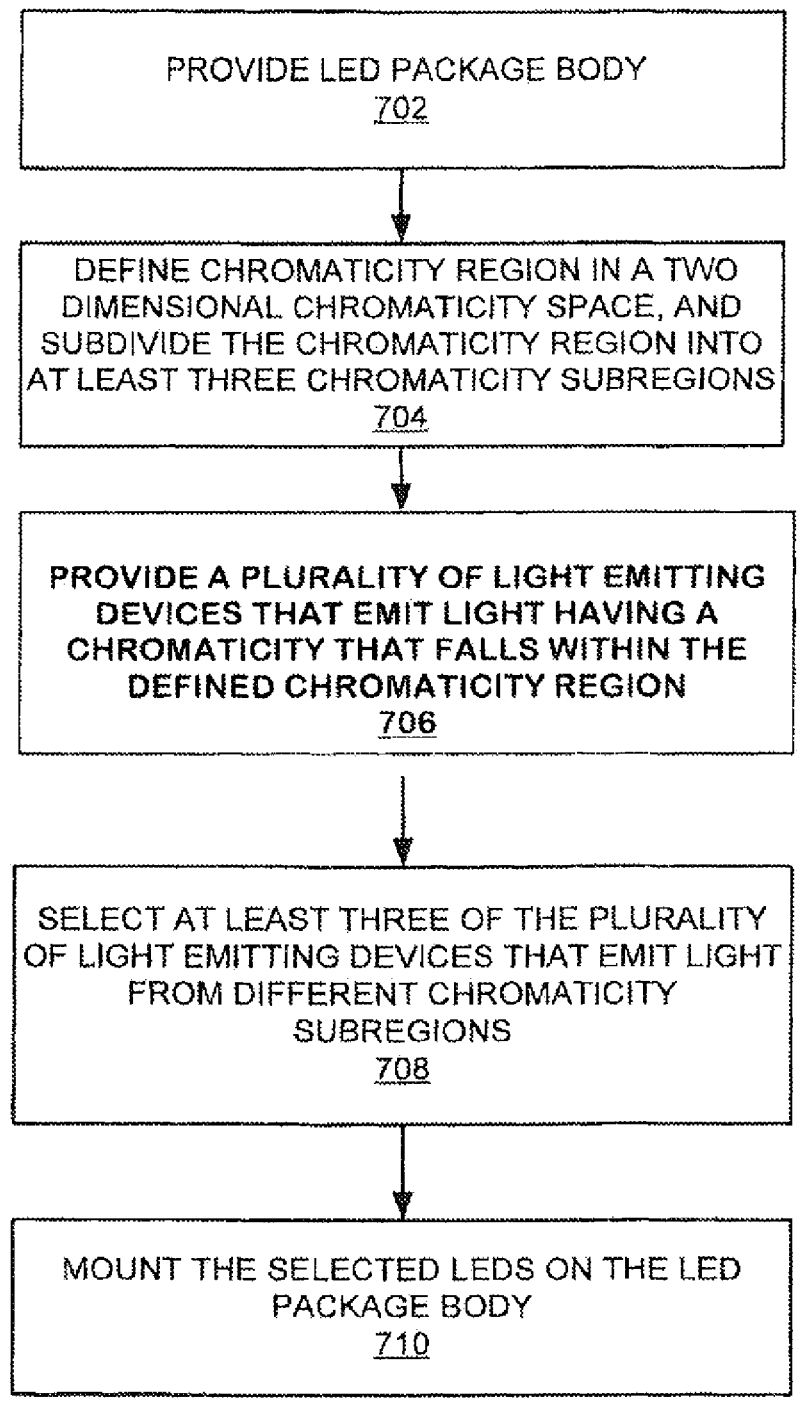

Reference is now made to FIG. 20, which is a graph of intensity versus color temperature (CCT) for LEDs according to some embodiments. When a plurality of LEDs, or strings of LEDs are driven independently according to various embodiments to generate combined light having a color point that is tuned to a point within a tuning region, the intensity of the combined light may vary from a high intensity when all of the LEDs are on (for example to tune to a color point near the center of the tuning region) to a low intensity when only a subset of the LEDs are on (for example, to tune to a color point near the maximum or minimum CCT of the tuning region).

For example, consider an LED package assembly 100 as illustrated in FIG. 1A in which the four LEDs 120A to 120D are selected from respective chromaticity regions 830A to 830D as shown in FIG. 15. The tuning region for such a device spans a CCT range of about 4000K to about 2700K. When the light emission intensities of the LEDs 120A to 120D are independently adjusted to generate a combined light having a CCT of 2700K, substantially all of the light emission from the package assembly 100 will be from only two of the LEDs, namely LEDs 120C and 120D. Similarly, when the light emission intensities of the LEDs 120A to 120D are independently adjusted to generate a combined light having a CCT of 4000K, substantially all of the light emission from the package assembly 100 will be from LEDs 120A and 120B. However, when the light emission intensities of the LEDs 120A to 120D are independently adjusted to generate a combined light having a CCT of 3200K (near the center of the tuning region 820), all four LEDs 120A to 120D will contribute to the combined light emission. Accordingly, the total luminous flux from the package 100 may appear to brighten, and then dim, as the light output is tuned from 4000K to 2700K.

To equalize the luminous flux generated by the package 100 as the light output is tuned across the range of available color temperatures for a given collection of LEDs, the intensity of light emission from each LED may be adjusted to be greater near the extrema of the CCT range and lower near the middle of the CCT range, as illustrated by curve 1100 in FIG. 20. As shown therein, the light emission intensity for a given LED may vary from a maximum intensity Imax when the device is tuned to a CCT near the ends of the CCT range down to a minimum intensity Imin when the device is tuned near the middle of the CCT range.

As noted above, the intensity of emission from a given LED may be varied by changing the drive current level, the average drive current level, the duty cycle of a PWM or PFM current drive signal, etc.

Although illustrated in FIG. 20 as nonlinear variation from Imax to Imin, the variation in intensity may be linear with CCT. In some embodiments, a desired variation characteristic may be determined empirically and stored in the luminaire, for example, in a lookup table.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A light emitting device package assembly, comprising:
a light emitting device package body; and
first, second and third white light emitting devices on the package body, wherein each of the first, second and third white light emitting devices emits light when energized having a chromaticity that falls within a respective one of first, second and third non-overlapping chromaticity regions in a two dimensional chromaticity space, wherein the first, second and third chromaticity regions are spaced apart in the two dimensional chromaticity space by respective regions having at least the size of a seven step MacAdam ellipse, and wherein the first and second chromaticity regions comprise white light having a correlated color temperature not greater than 3000K.

2. The light emitting device package assembly of claim 1, wherein the first chromaticity region comprises light having a chromaticity that falls on a first side of a black body locus in the two dimensional chromaticity space, and wherein the second chromaticity region comprises light having a chromaticity that falls on a second side, opposite the first side, of the black body locus in the two dimensional chromaticity space.

3. The light emitting device package assembly of claim 1, wherein the third chromaticity region comprises light having a color temperature not less than 4500K.

4. The light emitting device package assembly of claim 1, wherein the third chromaticity region comprises light having a correlated color temperature between 2700K and 5000K.

5. The light emitting device package assembly of claim 1, wherein the first, second and third chromaticity regions are spaced apart in the two dimensional chromaticity space by respective regions having at least the size of a fourteen step MacAdam ellipse.

6. The light emitting device package assembly of claim 1, wherein the first, second and third chromaticity regions are spaced apart in the two dimensional chromaticity space by respective regions having at least the size of a twenty step MacAdam ellipse.

7. The light emitting device package assembly of claim 1, wherein the light emitting device package body includes at least three pairs electrical leads that are mutually isolated from one another and that are electrically connected to respective anodes and cathodes of the first, second and third light emitting devices.

8. The light emitting device package assembly of claim 1, further comprising a fourth white light emitting device on the package body, wherein the fourth white light emitting device emits light when energized having a chromaticity that falls within a fourth chromaticity region in the two dimensional chromaticity space that is non-overlapping with the first, second and third chromaticity regions and that is spaced apart from the first, second and third chromaticity regions by respective regions having at least the size of a seven step MacAdam ellipse.

9. The light emitting device package assembly of claim 8, wherein the third chromaticity region comprises light having a chromaticity that falls on the first side of a black body locus in the two dimensional chromaticity space, and wherein the fourth chromaticity region comprises light having a chromaticity that falls on the second side of the black body locus in the two dimensional chromaticity space.

10. The light emitting device package assembly of claim 8, wherein the third and fourth chromaticity regions do not overlap the blackbody locus.

11. The light emitting device package assembly of claim 1, wherein combined light from the first, second and third white light emitting devices falls within a 7-step MacAdam ellipse of a point on the black body locus.

12. A solid state luminaire including a light emitting device package assembly as recited in claim 1.

13. The light emitting device package assembly of claim 1, wherein the first and second chromaticity regions do not overlap the blackbody locus.

14. The light emitting device package assembly of claim 1, wherein the third chromaticity region overlaps the blackbody locus.

15. The light emitting device package assembly of claim 1, wherein the third chromaticity region comprises light having a color temperature not less than 3000K.

16. The light emitting device package assembly of claim 1, wherein the first and second chromaticity regions comprise light having x, y color coordinates within an area on a 1931

CIE Chromaticity Diagram defined by points having coordinates of (0.4373, 0.3893), (0.4562, 0.4260), (0.4813, 0.4319), and (0.4593, 0.3944).

17. The light emitting device package assembly of claim 1, wherein the third chromaticity region comprises light having x, y color coordinates within an area on a 1931 CIE Chromaticity Diagram defined by points having coordinates of (0.3080, 0.3110), (0.3010, 0.3420), (0.3290, 0.3690), and (0.3290, 0.3300).

18. The light emitting device package assembly of claim 1, wherein at least one of the first, second and third white light emitting devices has a color rendering index that is at least about 10 points greater than a color rendering index than another one of the first, second and third white light emitting devices.

19. The light emitting device package assembly of claim 1, wherein at least one of the first, second and third white light emitting devices has a color rendering index that is greater than 85 and another one of the first, second and third white light emitting devices has a color rendering index that is less than 85.

20. A solid state luminaire, comprising:
first, second and third groups of white light emitting devices, wherein each of the first, second and third strings of white light emitting devices emit light when energized having a chromaticity that falls within a respective one of first, second and third non-overlapping chromaticity regions in a two dimensional chromaticity space, wherein the first, second and third chromaticity regions are spaced apart in the two dimensional chromaticity space by respective regions having at least the size of a seven step MacAdam ellipse, and wherein the first and second chromaticity regions comprise white light having a correlated color temperature not greater than 3000K.

21. The solid state luminaire of claim 20, wherein the first chromaticity region comprises light having a chromaticity that falls on a first side of a black body locus in the two dimensional chromaticity space, and wherein the second chromaticity region comprises light having a chromaticity that falls on a second side, opposite the first side, of the black body locus in the two dimensional chromaticity space.

22. The solid state luminaire of claim 20, wherein the first, second and third chromaticity regions are spaced apart in the two dimensional chromaticity space by respective regions having at least the size of a fourteen step MacAdam ellipse.

23. The solid state luminaire of claim 20, wherein the first, second and third chromaticity regions are spaced apart in the two dimensional chromaticity space by respective regions having at least the size of a twenty step MacAdam ellipse.

24. The solid state luminaire of claim 20, further comprising a fourth group of white light emitting devices, wherein the fourth group of white light emitting devices emits light when energized having a chromaticity that falls within a fourth chromaticity region in the two dimensional chromaticity space that is non-overlapping with the first, second and third chromaticity regions and that is spaced apart from the first, second and third chromaticity regions by respective regions having at least the size of a seven step MacAdam ellipse.

25. The solid state luminaire of claim 24, wherein the third chromaticity region comprises light having a chromaticity that falls on the first side of a black body locus in the two dimensional chromaticity space, and wherein the fourth chromaticity region comprises light having a chromaticity that falls on the second side of the black body locus in the two dimensional chromaticity space.

26. The solid state luminaire of claim 20, wherein at least a first white light emitting device of the first, second and third groups of white light emitting devices has a color rendering index that is at least about 10 points greater than a color rendering index than a second white light emitting device of the first, second and third groups of white light emitting devices.

27. The solid state luminaire of claim 26, wherein the first white light emitting device has a color rendering index that is greater than 85 and the second white light emitting device has a color rendering index that is lower than 85.

28. The solid state luminaire of claim 20, wherein the third chromaticity region comprises light having a correlated color temperature between 2700K and 5000K.

29. A light emitting device package assembly, comprising:
a light emitting device package body; and
first, second and third white light emitting devices on the package body, wherein each of the first, second and third white light emitting devices emits light when energized having a chromaticity that falls within a respective one of first, second and third non-overlapping chromaticity regions in a two dimensional chromaticity space, and wherein the first and second chromaticity regions comprise white light having a correlated color temperature not greater than 3000K;
wherein chromaticity of combined light output by said light emitting diode package assembly is tunable to at least one of a plurality of points within a tuning region within the two dimensional chromaticity space defined by at least the chromaticities of said first, second, and third light emitting devices wherein the first, second and third chromaticity regions are spaced apart in the two dimensional chromaticity space by respective regions having at least the size of a seven step MacAdam ellipse.

30. The light emitting device package assembly of claim 29, wherein the first, second and third chromaticity regions are at least as large as a seven step MacAdam ellipse.

31. The light emitting device package assembly of claim 29, wherein the first, second and third chromaticity regions are spaced apart in the two dimensional chromaticity space by respective regions having at least the size of a fourteen step MacAdam ellipse.

32. The light emitting device package assembly of claim 29, wherein the first, second and third chromaticity regions are spaced apart in the two dimensional chromaticity space by respective regions having at least the size of a twenty step MacAdam ellipse.

* * * * *

UNITED STATES PATENT AND TRADEMARK OFFICE
CERTIFICATE OF CORRECTION

PATENT NO. : 8,339,029 B2
APPLICATION NO. : 12/756725
DATED : December 25, 2012
INVENTOR(S) : Kim et al.

It is certified that error appears in the above-identified patent and that said Letters Patent is hereby corrected as shown below:

On the Title Page:
Item (75)
    Inventor "Gregory S. Blbee, Raleigh, NC (US);"
    to read -- Gregory S. Bibee, Raleigh, NC (US); --

In the Drawings:
    Replace Figure 13 with the attached Replacement Sheet

Signed and Sealed this
Second Day of April, 2013

Teresa Stanek Rea
*Acting Director of the United States Patent and Trademark Office*